(12) United States Patent
Holland

(10) Patent No.: US 7,880,282 B2
(45) Date of Patent: Feb. 1, 2011

(54) SEMICONDUCTOR PACKAGE WITH INTEGRATED HEATSINK AND ELECTROMAGNETIC SHIELD

(75) Inventor: Andrew Holland, Fulbourn (GB)

(73) Assignee: RF Module & Optical Design Ltd., Cambridge (GB)

( * ) Notice: Subject to any disclaimer, the term of this patent is extended or adjusted under 35 U.S.C. 154(b) by 814 days.

(21) Appl. No.: 10/583,525

(22) PCT Filed: Dec. 17, 2004

(86) PCT No.: PCT/GB2004/005217
§ 371 (c)(1),
(2), (4) Date: Jun. 16, 2006

(87) PCT Pub. No.: WO2005/059995
PCT Pub. Date: Jun. 30, 2005

(65) Prior Publication Data
US 2007/0164409 A1    Jul. 19, 2007

(30) Foreign Application Priority Data
Dec. 18, 2003  (GB) ................................ 0329351.1
Oct. 19, 2004  (GB) ................................ 0423172.6

(51) Int. Cl.
*H01L 23/02* (2006.01)

(52) U.S. Cl. ................. 257/678; 257/684; 257/731; 257/773

(58) Field of Classification Search ............ 257/678, 257/684, 731, 773
See application file for complete search history.

(56) References Cited

U.S. PATENT DOCUMENTS 5,057,903 A    10/1991    Olla (Continued)

FOREIGN PATENT DOCUMENTS

DE    199 15 065 A1    2/2000

(Continued)

OTHER PUBLICATIONS

PCT Notification Concerning Transmittal of International Preliminary Report on Patentability (Chapter I of the Patent Cooperation Treaty) for International Application No. PCT/GB2004/005217, Jun. 29, 2006 (7 pages).

*Primary Examiner*—Thien F Tran
(74) *Attorney, Agent, or Firm*—Hoffmann & Baron, LLP

(57) ABSTRACT

The invention provides a mounting for a printed circuit board which mounting is suitable for receiving a semiconductor assembly wherein the mounting comprises: a base support having a semiconductor assembly facing surface, and an opposed printed surface board facing surface; a cover having a semiconductor assembly facing surface, an opposed heat radiating surface; a connecting formation which joins the cover to the base support and provides an electrical and thermal communication between the cover and the base support wherein the connecting formation has a semiconductor assembly facing surface, an outer opposed surface and a thickness between the two surfaces; and a plurality of package connectors extending from the base support each of which package connectors have a printed surface board facing surface; an array of mountings; and a semiconductor package comprising a semiconductor assembly having one or more semiconductor chips, which assembly is mounted on the mounting wherein the package connectors of the mounting are in a spaced relationship with the base support and are linked electrically with the semiconductor assembly and the cover is arranged to be in a spaced parallel relationship with the base support.

29 Claims, 44 Drawing Sheets

U.S. PATENT DOCUMENTS

| | | | |
|---|---|---|---|
| 5,536,906 | A | 7/1996 | Haas, Jr. et al. |
| 6,165,817 | A | 12/2000 | Akram et al. |
| 6,376,907 | B1 | 4/2002 | Takano et al. |
| 2003/0081392 | A1 | 5/2003 | Cady et al. |
| 2003/0193794 | A1 | 10/2003 | Reis et al. |

FOREIGN PATENT DOCUMENTS

| | | |
|---|---|---|
| EP | 1 049 192 A2 | 11/2000 |
| JP | 05-166988 | 7/1993 |
| JP | 05-166988 A | 7/1993 |
| JP | 06-350012 | 12/1994 |
| JP | 07-288332 | 10/1995 |
| JP | 07-288332 A | 10/1995 |

(a)          (b)

(a)          (b)

| Monitor Point | Frequency | Std Pkg | | New Pkg. | | Shield Effectiveness | |
|---|---|---|---|---|---|---|---|
| | | E | H | E | H | E Field | H Field |
| | GHz | dBV/m | dBA/m | dBV/m | dBA/m | dB | dB |
| +Z | 0.9 | -2 | -21 | -12 | -42 | 10 | 21 |
| +Z | 2.4 | 7 | -22 | -4 | -42 | 11 | 20 |
| +Z | 5.2 | 13 | -22 | 5 | -41 | 8 | 19 |
| +Z | 10.0 | 16 | -19 | 11 | -39 | 5 | 20 |

Fig. 46

| Semiconductor Chip | Die Size | Material | Power Dissipation |
|---|---|---|---|
| Daughter Die 1 | 1.8x0.9x0.2mm | Silicon | 100mW |
| Daughter Die 2 | 2.1x1.1x0.2mm | Gallium Arsenide | 1W |
| Mother Die 3 | 2.65x2.65x0.2mm | Glass-Quartz | 100mW |

Fig. 47

| Monitor Point | Standard Package | New Package |
|---|---|---|
| | Temp (deg C) | Temp (deg C) |
| Daughter Die 2 | 137 | 116 |
| % Improvement | - | 22 |

Fig. 48

SEMICONDUCTOR PACKAGE WITH INTEGRATED HEATSINK AND ELECTROMAGNETIC SHIELD

CROSS-REFERENCE TO RELATED APPLICATIONS

This application is the National Stage of International Application No. PCT/GB2004/005217, filed on Dec. 17, 2004, which claims priority to GB Application No. 0329351.1, filed on Dec. 18, 2003, and GB Application No. 0423172.6, filed on Oct. 19, 2004, the contents of which is incorporated by reference herein.

FIELD OF THE INVENTION

The present invention relates to semiconductor packages, mounting assemblies therefor and methods of manufacture thereof, and more particularly but not solely to, micro mounting packages that have an integrated heatsink and electromagnetic shield.

BACKGROUND OF THE INVENTION

The objective of any electronics package is to protect sensitive integrated circuits from harsh environments without inhibiting electrical performance. The package is used to electrically and mechanically attach a chip to an intended device. One popular family of electronics package is the Micro Leadframe Packaging (MLP) also known as Quad-Flat-No-Lead (QFN) or Dual-Flat-No-Lead (DFN). MLP is based upon a patterned and etched metal mounting commonly with a central pad, onto which a single or multiple semiconductor chips or dies are mounted, connected with wirebonds to isolated package pins, then encapsulated in a plastic sealing material. The sealing material is applied around the metal of the mounting and the integrated circuit with wirebonds to form a hard, protective plastic body.

Further information relative to mounting technology may be found in Chapter 8 of the book Micro Electronics Packaging Handbook, (1989), edited by R. Tummala and E. Rymaszewski, incorporated by reference herein. This book is published by Van Nostrand Reinhold, 115 Fifth Avenue, New York, N.Y.

Generally, manufacture is completed using an array of multiple MLP mountings. After encapsulation a mounting is separated from any supporting peripheral mounting structures and neighbouring packages by a punch or a saw.

It may be stated generally that there is a desire in the electronics packaging industry to reduce size and cost whilst at the same time as integrating more functionality. One proven route to increase functionality is to include several integrated circuits in the same MLP. Modern assembly techniques allow dies to be stacked or flip mounted (i.e. mounted in an inverted orientation) known as "flip-chip" mounting, ensuring a minimal final package size.

There are additional problems to be solved in the electronics packaging industry. One such problem is that many types of integrated circuit produce high levels of unwanted thermal energy, even when in normal operation. These circuits still require integration. Thermal design is also important and a method of dissipating heat to maintain electrical and mechanical stability has been sought.

Another such problem is that many electronics products need to operate in an electrically noisy environment. A method of protecting a sensitive integrated circuit within the package from unwanted electrical interference has also been sought.

A further such problem is that many electronics products require direct electrical connection to the system ground potential to obtain optimum performance. If this connection is electrically impaired (e.g. by resistive or inductive impairment) many integrated circuits particularly operating at intermediate and high frequencies or with high electrical currents may be adversely affected. A method of providing a low resistance, low inductance path to system ground has been sought.

SUMMARY OF THE INVENTION

The present invention relates to a semiconductor package, a mounting assembly therefor and a method of manufacture, and more particularly but not limited to, a micro mounting package that has an integrated heatsink and electromagnetic shield.

According to a first aspect of the invention there is provided a mounting for a semiconductor assembly including a first portion for mounting at least one semiconductor device, a second portion and a connecting portion joining the first and second portions and arranged to allow folding of the second portion over the semiconductor device.

The connecting portion may provide thermal and electrical communication between the first and second portions of the mounting.

The first portion of the mounting may comprise a formation of leadframe package connectors.

The first portion of the mounting may further comprise a base support for at least one semiconductor device.

The second portion may comprise a cover having a semiconductor assembly-facing surface and an opposed heat-radiating surface.

The electrical connectors of the mounting are in a spaced relationship with the base support and are linked electrically with the semiconductor assembly.

The cover is arranged to be in a spaced parallel relationship with the base support.

The cover may further comprise at least one additional edge portion arranged to extend when the mounting is folded beyond at least one edge of the first portion of the mounting. Such an edge portion can be folded to form a sidewall.

The mounting is preferably formed from a single sheet of electrically and thermally conducting material, which is preferably a metal, more preferably copper.

The mounting may be part of an array of a plurality of mountings.

The mounting is preferably provided with folding means to enable it to be bent such that the cover can be arranged to be in a spaced parallel relationship to the first portion. The folding means is preferably a weakened line, such as a scored line or an etched line in the mounting having a thickness that is less than that of the rest of the mounting.

Preferably the mounting includes two weakened lines, one between the first portion and the connecting portion and one between the second portion and the connecting portion.

The cover of the mounting is arranged to be mechanically and electrically connected to the base support and the base support is normally connected to System Ground potential (GND) on the final product printed circuit board. The particularly advantageous feature of the present invention is the cover which provides three functions (a) a simple heatsink (b) a low resistance, low inductive path to electrical Ground (GND) and (c) to act as a local electromagnetic shield protecting sensitive functions within, or without, from unwanted electromagnetic interference.

The semiconductor chip may be electrically connected to a portion of the mounting by wirebonding. Alternatively, the chip may be mounted using flip-chip mounting, such as bump soldering.

The new mounting package can be used for single or multiple chip applications. Where multiple chips are integrated it is often beneficial to "flip" smaller (daughter) chips onto a larger (mother) die. The new package facilitates connection to a simple heatsink and electromagnetic shield and System Ground (GND). Through modern assembly techniques the present invention reduces cost and area usage on a printed circuit board whilst improving thermal and electrical performance.

The semiconductor assembly is preferably attached to the base support and/or the cover. Where the assembly comprises two or more semiconductor chips, it is preferably attached to the base support and the cover. This enables a daughter semiconductor chip to be connected more directly to system ground. The assembly is preferably electrically attached to the base support and/or cover, more preferably by conductive wire or conductive epoxy or solder material.

A semiconductor package incorporating the mounting preferably comprises a sealing material at least partially encapsulating the mounting and the semiconductor assembly. This is in order to protect and support the contents of the package. At least part of the printed circuit board facing surfaces of the package connectors and base support or the heat radiating surface of the cover may not be covered by the sealing material, being left exposed to aid the dissipation of heat.

The mounting preferably further comprises heat dissipation means to provide a low thermally resistive path between a mounted semiconductor assembly and the cover of the package.

The mounting may be provided with a third portion and second folding portion arranged to allow folding of the third portion over the semiconductor device. The third portion is in a spaced parallel relationship with the base support and second portion.

The mounting may further comprise means for mounting surface mount technology (SMT) components. Such components may comprise passive components, for example resistors, capacitors, or inductors.

Such means may comprise recesses in the mounting cover to mount SMT components.

The cover of the mounting may be patterned to function as a passive component. For example, the top cover may be formed as a serpentine inductor.

Other passive components can be integrated. The cover may be patterned as an interdigitated or parallel plate capacitor. The cover may also be patterned to integrate other components such as antenna, microstrip couplers and filters.

The mounting preferably further comprises an EMI enhanced package wherein the cover is fabricated with additional fold means to enable the cover to be bent to define walls in relationship with the semiconductor assembly.

The mounting may further comprise means adapted for mounting sensor semiconductor chips.

The cover of the mounting may be adapted to provide direct access to the semiconductor assembly. Such means may comprise an aperture in the package mounting cover. The mounting may be further adapted to mount optical components in relationship to an image sensor semiconductor chips.

The aperture may be further defined by having recesses about its perimeter. The recesses may face towards, or away from, a mounted semiconductor device. The aperture and the recesses can be used to locate further components for use in the semiconductor assembly.

The mounting may be further adapted to provide for mounting biometric semiconductor chips.

The mounting may be further adapted to provide for mounting pressure sensor semiconductor chips.

The mounting according to the invention preferably further comprises one or more recesses formed within the cover into which mould material can flow to secure the cover in the package.

The mounting according to the invention preferably further comprises means to permit coupling of selected frequencies of electromagnetic radiation through the leadframe. Such means may comprise apertures in the cover of the mounting of appropriate dimension to permit coupling at a selected frequency.

In another aspect of the invention there is provided a method of manufacturing a semiconductor assembly comprising the steps of:
preparing a mounting for a semiconductor device;
mounting a semiconductor chip on the mounting;
electrically connecting the semiconductor chip to the mounting; and
folding a portion of the mounting over the semiconductor assembly.

The step of preparing the mounting may further comprise forming functional features in the mountings. The features may be formed by, for example, cutting, scribing, stamping or etching.

The step of preparing a mounting may further comprise forming fold lines into the mountings.

The folded portion may be folded through a total of 180°, for example by being folded through 90° along each of two fold lines. The folded portion can then be in a spaced parallel relationship with the portion the semiconductor chip is mounted on.

The method may further comprise folding a further portion of the mounting over the semiconductor assembly.

The method may further comprise folding additional portions of the mounting to form, for example, sidewalls in the mounting.

The functional features may further include heatsinks. Passive components can also be formed in portions of the mounting.

The method may further comprise the step of sealing said mounting. Any suitable sealant could be used for this purpose, for example, a dielectric sealant.

The method further comprises forming an aperture in a portion of the mounting. Recesses can be defined about the perimeter of the aperture. The recesses may face towards, or away from, a mounted semiconductor device.

The method may further include mounting and aligning components for use in the semiconductor assembly. Such further components include optical components, such as lenses or filters.

The components may be mounted on the mounting before it is folded such that folding the mounting brings the component into the desired final position in the assembly.

The method may further comprise electrically connecting the semiconductor chip to using wirebonding.

The semiconductor chip may be flip-chip mounted.

The method further comprises mounting further semiconductor chips on the same mounting. The further chips can be mounted using adjacent or stacked wirebond and/or flip-chip mounting. The mounted chips can be connected to a common mounting and/or each other.

The mounting may be one of an array of such mountings.

The mounting can be separated from the array by, for example, cutting, punching or sawing.

In another aspect of the invention there is provided a method of manufacturing a semiconductor mounting wherein individual mountings are patterned on a sheet of conducting material, wherein the individual mountings are defined with a first portion for mounting at least one semiconductor device, a second portion and a connecting portion joining the first and second portions and arranged to allow folding of the second option over the semiconductor device.

The mountings may be patterned by casting, etching or stamping.

The sheet may be a suitable metal, for example, copper.

The individual mountings may be part of an array of such mountings. The method further includes the step of separating individual mountings from the array.

BRIEF DESCRIPTION OF THE DRAWINGS

The invention is illustrated with reference to the following Figures of the drawings wherein:

FIGS. 46 to 48 show the results of modelling packages according to the invention.

Before discussing the embodiments of the present invention, the prior art MLP-type semiconductor package is discussed below in order to provide background information regarding the techniques of construction of MLP-type semiconductor packaging.

DETAILED DESCRIPTION OF PREFERRED EMBODIMENTS

Figure 1:
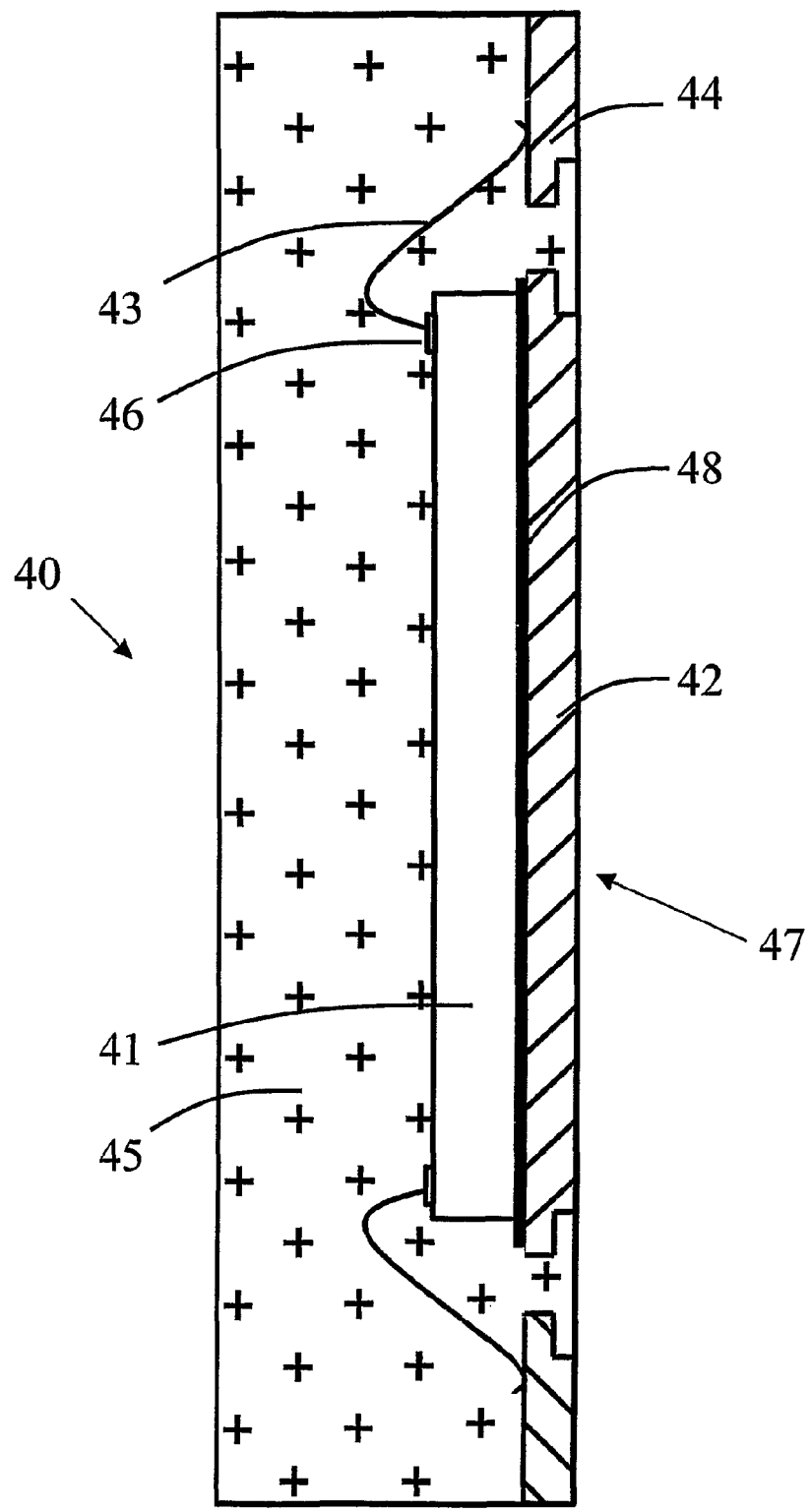
FIG. 1 shows a side elevation, cross-sectional view of a known MLP-type semiconductor package.

In reference to FIG. 1, there is shown a side-elevation, cross-sectional view of a known MLP-type semiconductor package 40. The semiconductor package contains a mounting 47 consisting of a base support (also referred to as a paddle or base mounting pad) 42, a plurality of package connectors (also referred to as package pins) 44, a single semiconductor chip 41 connected to the base 42 by bonding layer 48 and a plurality of wires (also referred to as wirebonds) 43 which link the chip 41 to the package connectors 44. The complete assembly is enclosed in a nonconductive sealing material 45. Sealing material 45 may be a thermoplastic or thermoset resin (including an epoxy, phenolic and/or silicone resin).

Numerous techniques for secure attachment of a semiconductor chip 41 to the base 42 are in practice, including conductive and/or nonconductive epoxy or solder 48. The top surface of the semiconductor chip 41, usually has, at its periphery, a plurality of connecting pads 46. A plurality of package connectors 44 surround the mounted semiconductor chip 41 and base 42. Wires 43 electrically connect to the semiconductor die connecting pads 46 and the package connectors 44. The package base support 42 and connectors 44 are rectangular in cross-section but may be etched to improve fixing to sealing material 45. The pluralities of package connectors 44 are commonly located at the periphery of the semiconductor package 40. The base support 42 is generally located centrally to the package base. Package connectors 44 and base support 42 are used to connect to a printed circuit board (PCB), not shown.

An MLP-type semiconductor package aids dissipation of heat generated from the operation of the semiconductor chip 41 via the lower exposed surface of the base support 42 and the lower and lateral exposed surfaces of the package connectors 44. Some heat is also dissipated from the upper surface, to air surrounding the semiconductor package 40. However the sealing material 45 tends to prevent this by insulating the semiconductor chip 41.

Semiconductor chips 41 are designed for many different applications and markets. Often there is an advantage in providing an electromagnetic shield over and in close proximity to the semiconductor chip 41. Such a shield may protect the semiconductor chip from unwanted interference from external radio signals and propagated waves but also protect the external system from signals generated from semiconductor chip 41 under its own operation.

The prior art package has no externally exposed top metal pad to aid additional thermal dissipation or to give electromagnetic shielding protection to the semiconductor chip 41 or external system by presenting a shield or barrier to radio signals. The prior art package does not allow direct connection to the rear face of a stacked (flip-chip) mounted daughter die when mounted to the upper surface of the semiconductor die 41 on the base 42.

FIGS. 2 to 4 and 6 to 14 illustrate aspects of the invention. In these Figures, like features are indicated by like identification numbers.

Figure 2:
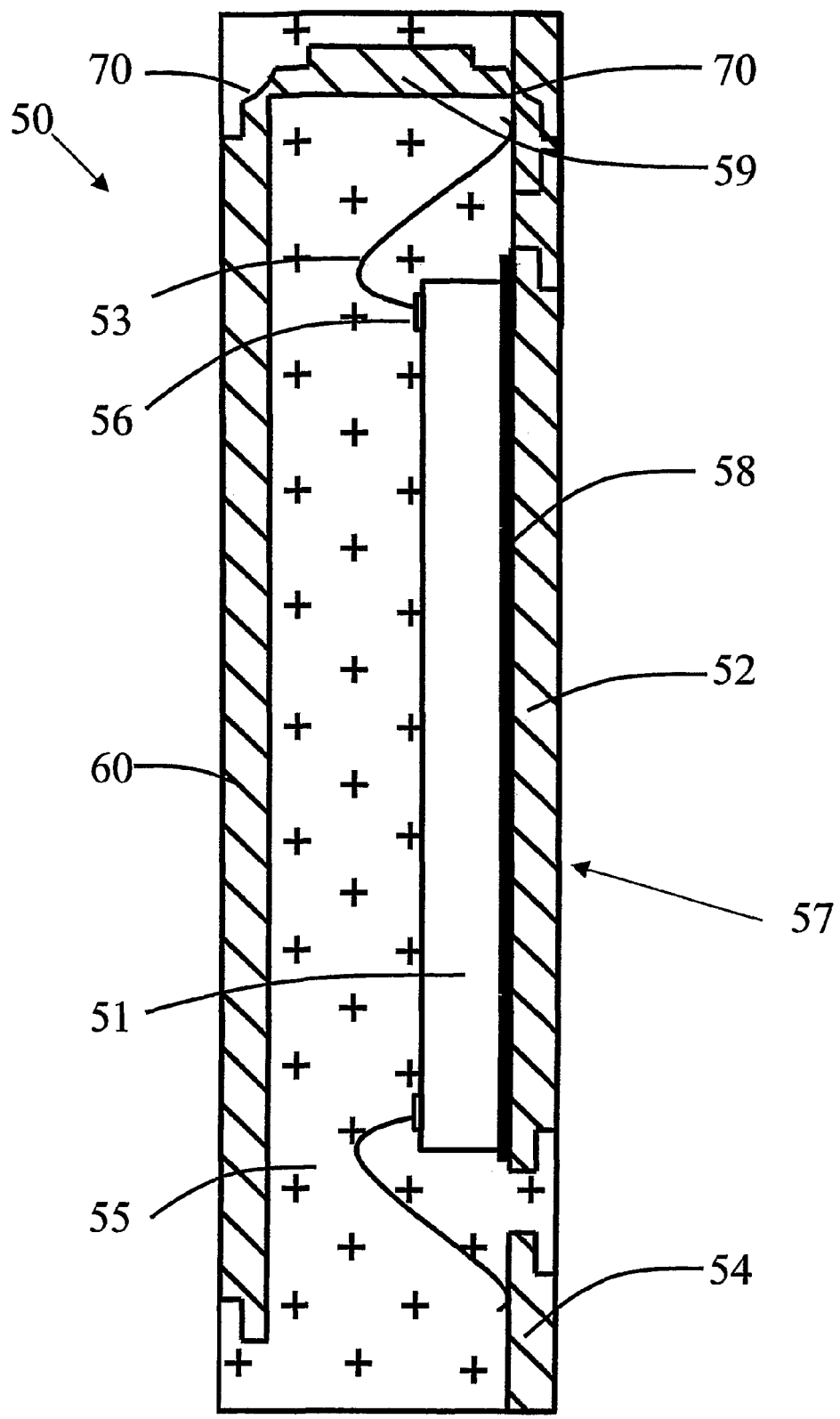
FIG. 2 shows a side elevation, cross-sectional view of an MLP-type semiconductor package according to the invention with a formed upper pad.

Referring to FIG. 2, here shown is a side-elevation, cross-sectional view of semiconductor package 50. This is the first embodiment of a semiconductor package according to the present invention. The semiconductor package contains a mounting 57 consisting of a base support 52, a cover 60, connecting formation 59, a plurality of package connectors 54, a single semiconductor chip 51 and a plurality of wires 53. The complete assembly is enclosed in a nonconductive sealing material 55. Sealing material 55 may be a thermoplastic or thermoset resin (including an epoxy, phenolic and/or silicone resin). FIG. 2 shows a semiconductor chip 51 mounted to the base support 52. Numerous techniques of secure attachment are in practice, including conductive and nonconductive epoxies, or solder 58. The top surface of the semiconductor chip 51, usually has, at its periphery, a plurality of connecting pads 56. A plurality of package connectors 54 surround the mounted semiconductor chip 51 and base support 52. Wires 53 electrically connect to the semiconductor die connecting pads 56 and the package connectors 54. The pluralities of package connectors 54 are located at the periphery of the semiconductor package 50. The base support 52 is generally located centrally to the package base. Package connectors 54 and base support 52 are used to connect to a printed circuit board (not shown).

The connecting formation 59 connects the base support 52 and cover 60. The connecting formation 59 provides a low resistance, low inductance thermally efficient path from the cover 60 to the base mounting pad 52 and to the external printed circuit board (not shown). The base support 52 and cover 60, the connecting formation 59 and package connectors 54 are secured to a mounting foil via mounting supporting structures or tie-bars (not shown). Tie bars and other supporting structures are trimmed off at the package dicing stage of manufacture.

The mounting 57 may be etched to provide additional locking strength between the mounting 57 and the sealing material 55. The connecting 30 formation 59 has a weakened fold line in the form of a lateral etch, cut or scribe used at each end of the connecting formation 59 to define bend points 70 for the formation of the cover 60 of the package. The top side of the base support 52 is attached to the semiconductor chip while the bottom side of the base mounting pad 52 is exposed to the outside of the semiconductor package 50. The bottom side of the base support 52 and the upper side of the cover 60 are electroplated with a corrosion-minimizing material such as tin, gold, tin lead, tin bismuth, nickel palladium or other suitable alloy. The bottom side of the base support 52 will be mounted to the printed circuit board (not shown). The topside of the cover 60 is exposed to the outside of the semiconductor package 50 and is generally centrally located in the top surface of the package.

The mounting 57 is fabricated from a sheet of electrically and heat conducting material such as copper. Heat generated from the operation of the semiconductor chip 51 is dissipated throughout the semiconductor package and through the bottom of the base mounting pad 52 to the printed circuit board. The exposed cover 60 will aid heat dissipation. Heat will also be dissipated through the plurality of package connectors 54. The plurality of package connectors 54 does not normally touch the base mounting pad 52.

Still referring to FIG. 2, semiconductor package 50 has a semiconductor chip 51 attached to the base support 52 via an adhesive or suitable solder material 58. The plurality of package connectors 54 electrically connect to the semiconductor chip 51 through a plurality of wires 53. Each wire 53 has a first end electrically connected to one of the bond pads 56 on the top side of the semiconductor chip 51 and a second end connected to the lower portion of one of the package connectors 54. Wires can be made of any electrically conductive material; gold aluminium or silver are common choices.

Sealing material 55 preserves the spatial relationship between the cover 60 and the base support 52, the connecting formation 59, wires 53, mounted semiconductor chip 51, and semiconductor package connectors 54. The sealing material 55 forms a rigid structure to maintain protection and form to the semiconductor package 50 and its component parts. After sealing only the areas of the base support 52 and cover 60, lower and outer edges of the package pins 54 remain exposed allowing connection to a printed circuit board.

Figure 3:
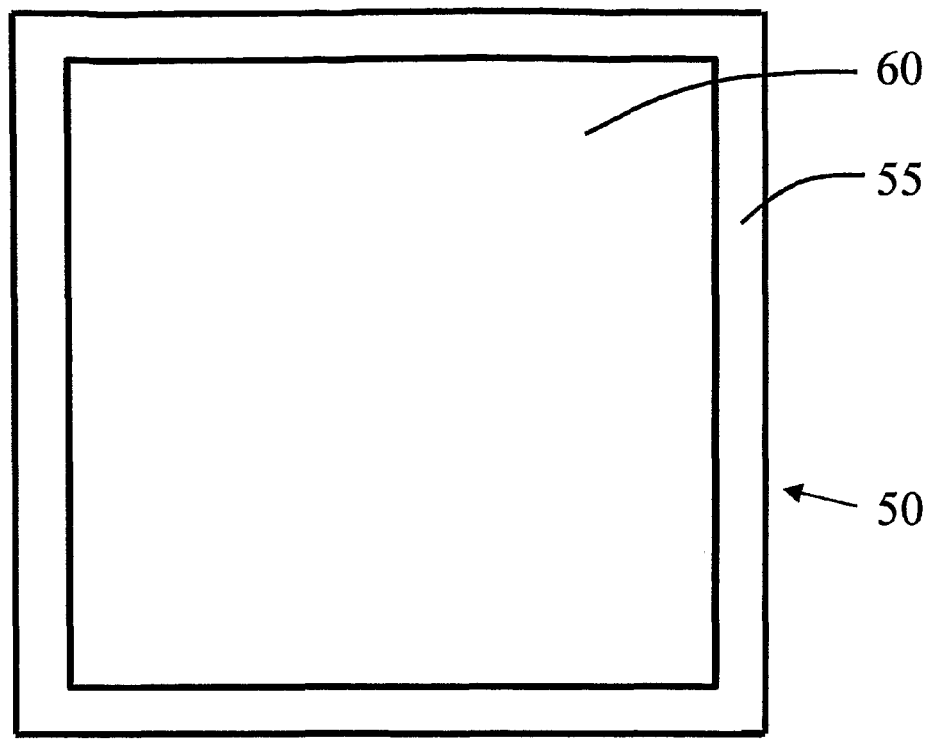
FIG. 3 shows a top plan view of an MLP-type semiconductor package according to the invention.

FIG. 3 shows a top plan view of semiconductor package 50. The cover 60 is located generally to the middle of the semiconductor package 50. At the four edges of the semiconductor package 50 sealing material 55 is shown defining the outer edge. The sealing material 55 ensures an interlocking structure with the cover 60. Only the upper portion of the cover 60 is exposed.

Figure 4:
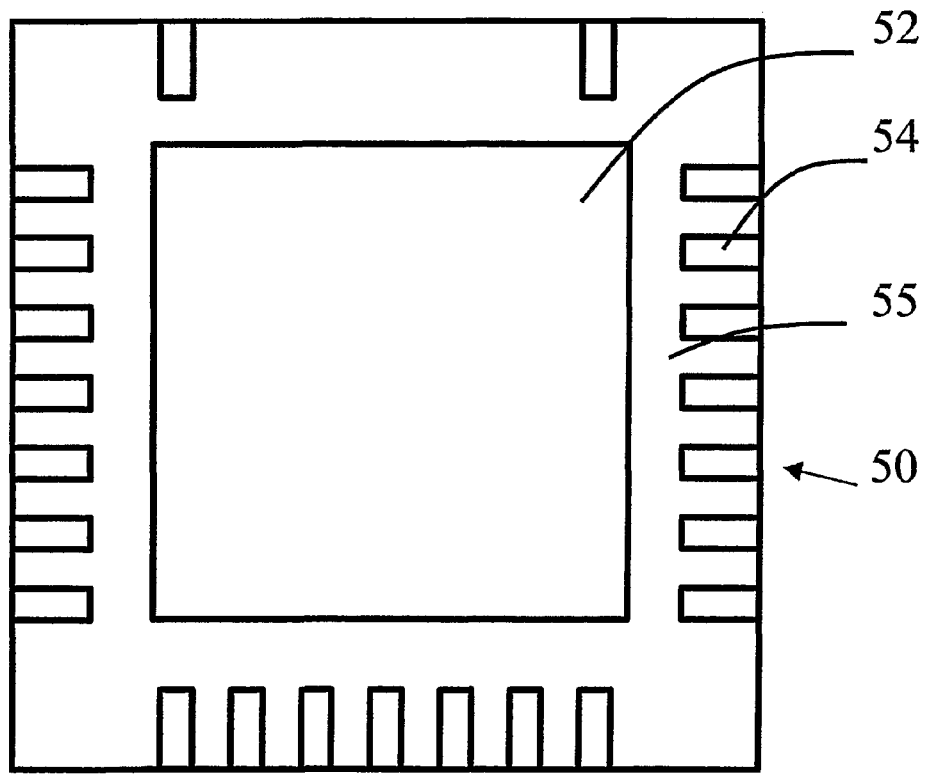
FIG. 4 shows a bottom plan view of an MLP-type semiconductor package according to the invention.

FIG. 4 shows a bottom plan view of the semiconductor package 50. As shown the base support 52 is located, generally, to the middle of the semiconductor package 50, surrounded on four sides by a plurality of package connectors 54. At the four edges of the semiconductor package 50, sealing material 55 defines the outer edge. The sealing material 55 ensures an interlocking structure with the base support 52 and package connectors 54. Only the lower exposed and plated portion of the package connectors 54 and base support 52 are visible.

Figure 5:
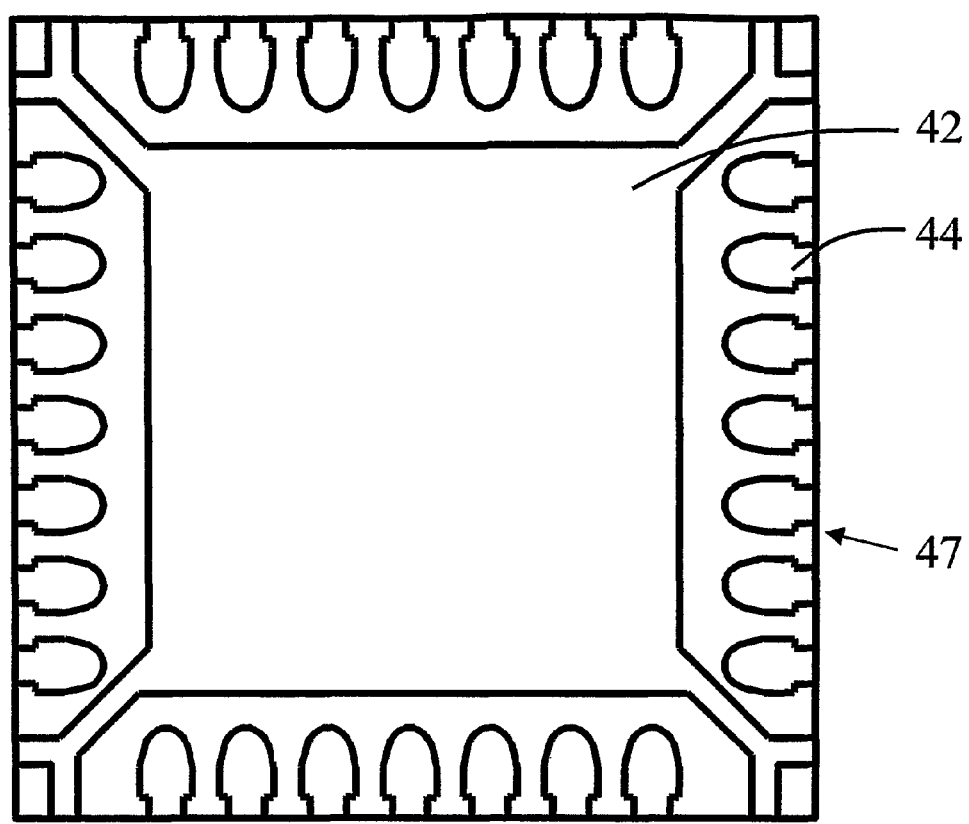
FIG. 5 shows a plan view of a known MLP-type semiconductor mounting.

FIG. 5 shows a top plan view of a known MLP-type package 47 for a semiconductor package 40. As shown the base support 42 is located generally to the middle of the semiconductor package 40, surrounded on four sides by a plurality of package connectors 44.

Figure 6:
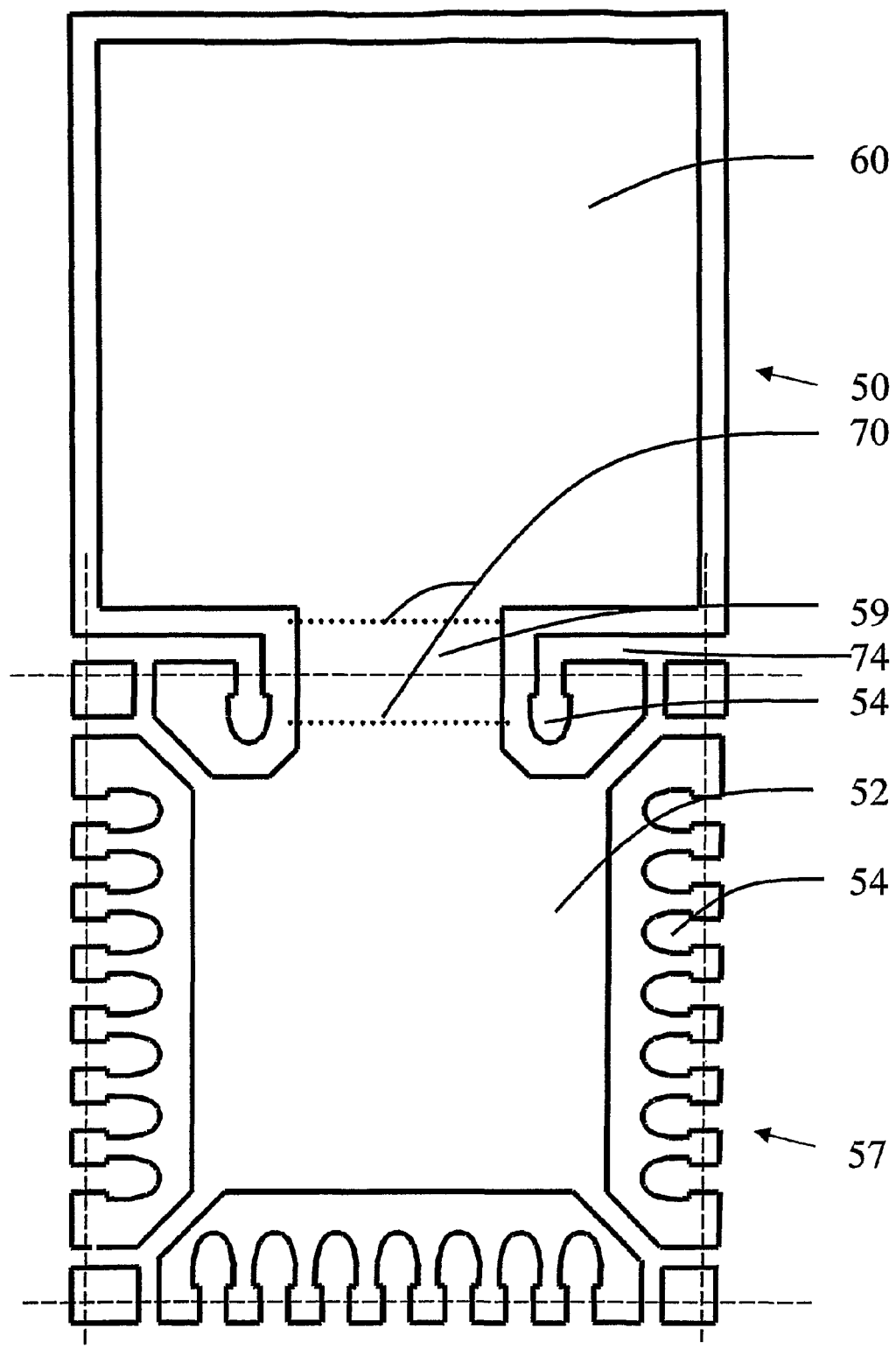
FIG. 6 shows a plan view of an MLP-type semiconductor mounting according to the invention, laid flat and showing formed upper pad prior to bend.

FIG. 6 shows a plan view of a mounting 57 for a semiconductor package 50 according to the present invention shown in its basic state prior to bending. Support structures 74 for mounting definition are shown for two pins on the package near to where the connecting formation 59 is defined. Other tie-bars and support structures for mounting manufacture are not shown, however the plurality of package connectors 54 are shown interconnected as the case may be before trimming. Etched or scribed bend points 70 (dotted) are positioned to define the connecting formation 59. A dashed line is shown intersecting each about the plurality of package connectors 54. The dashed line indicates the package outer dimension after dicing.

Figure 7:
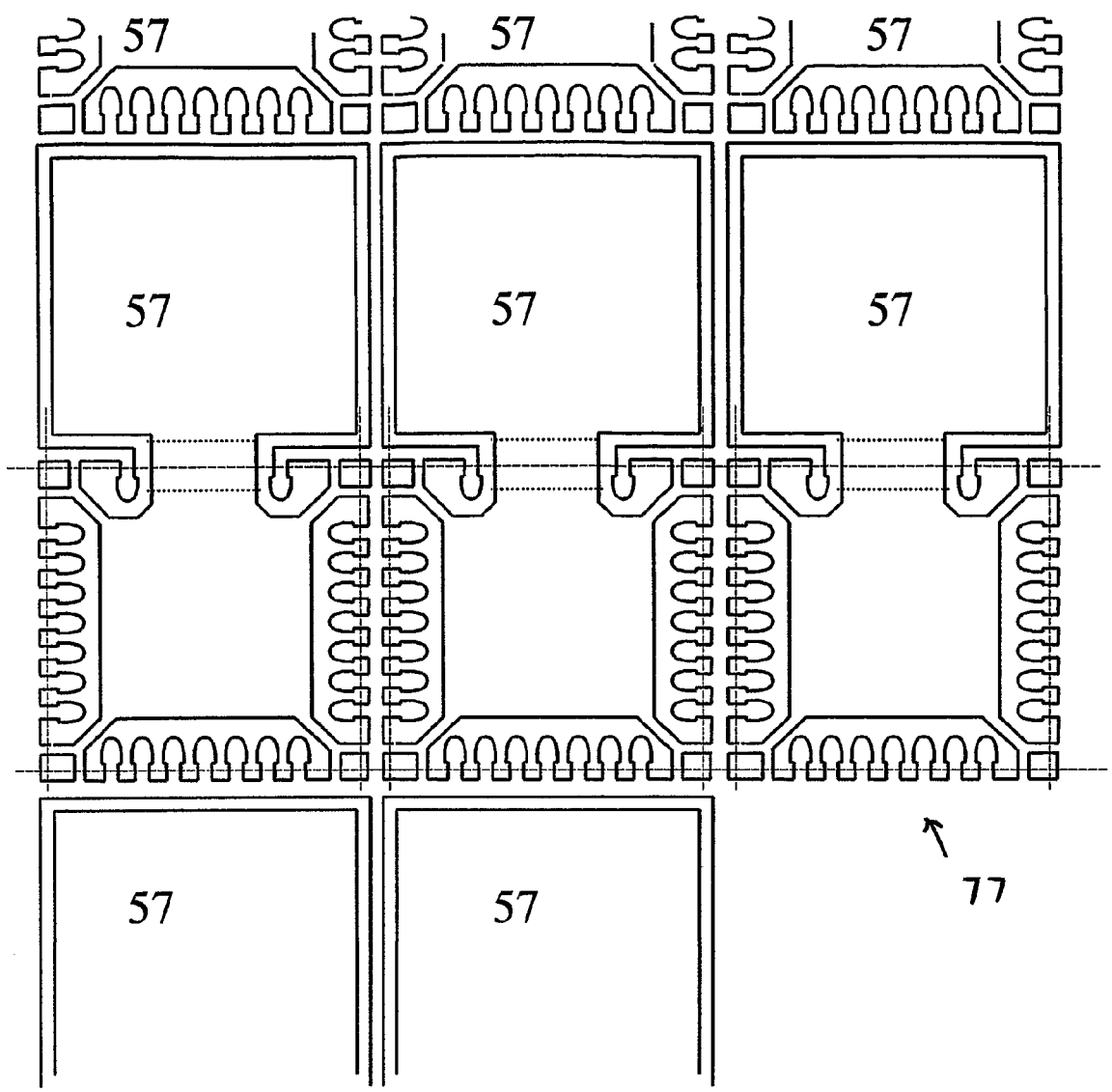
FIG. 7 shows a plan view of a manufacturing array of mountings according to the present invention.

FIG. 7 shows a plan view of an array 77 of multiple individual mountings 57 for semiconductor package 50 to show how an individual mounting 57 may be manufactured from a larger area of metal material. The array 77 can be initially manufactured by a variety of process, for example, casting, etching or stamping.

The array layout allows for the simple assembly of a semiconductor package. Using the array shown in FIG. 7 as an example, a semiconductor chip 51 can be mounted on individual MLP mountings 57 as shown. Semiconductor chips can be placed on each mounting using standard techniques, for example, processing the array to fix and solder the components on the mount. The processing can include solder bumping, epoxying and wire connecting. The packages can be further processed, for example using such techniques as solder reflow, injection of dielectric 55 onto the mount, semiconductor-mounting binder curing and so forth.

The individual mounts are then folded through 90° along each of the fold lines 70 so that the cover 60 extends over the chip 51, parallel to the base 52 and connectors 54. The sealing material 55 is then injected between the cover and the chip 51. Mountings can be separated from any supporting peripheral mounting structures and neighbouring packages by, for example, a punch or a saw that cuts along the dashed lines of FIG. 6. Since the fold lines 70 are within the dashed lines after folding, the connecting portion 59 remains in place after cleaving. Alternatively, the individual MLPs can be cut and processed individually.

Figure 8:
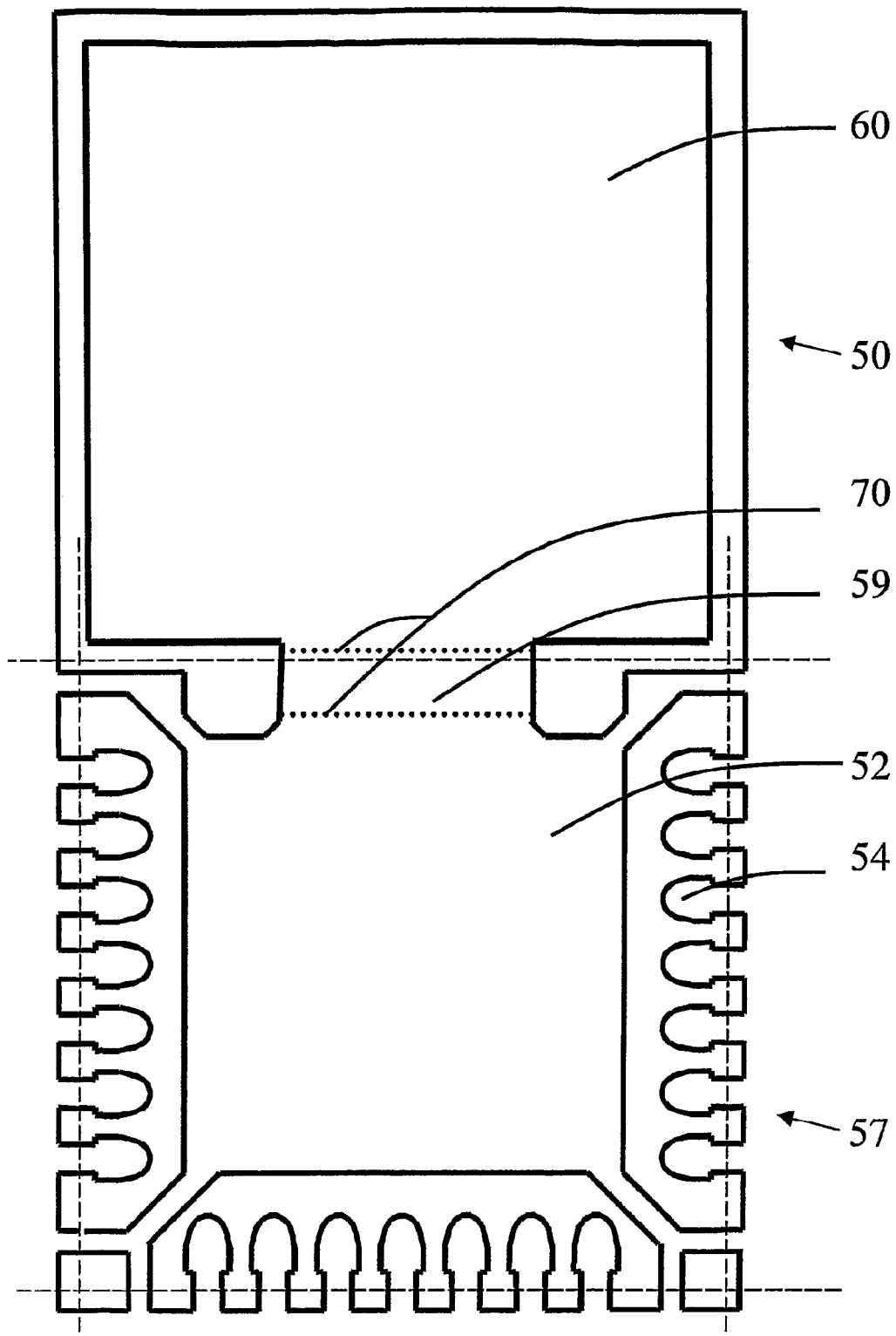
FIG. 8 shows a plan view of a laid flat MLP-type semiconductor mounting according to the present invention wherein the mounting has no package connectors on the edge adjacent the cover to maximise the area of the connecting formation.

FIG. 8 shows a plan view of a variation of the mounting 57 shown in FIG. 6 for a semiconductor package 50. In the mounting shown in FIG. 8, there are no pins on side adjacent the connecting formation 59. Tie-bars and support structures for mounting manufacture are omitted, however the plurality of package connectors 54 for the other three sides are shown interconnected as the case may be before trimming. A semiconductor package using this type of amounting can be assembled using the same techniques described above.

Figure 9:
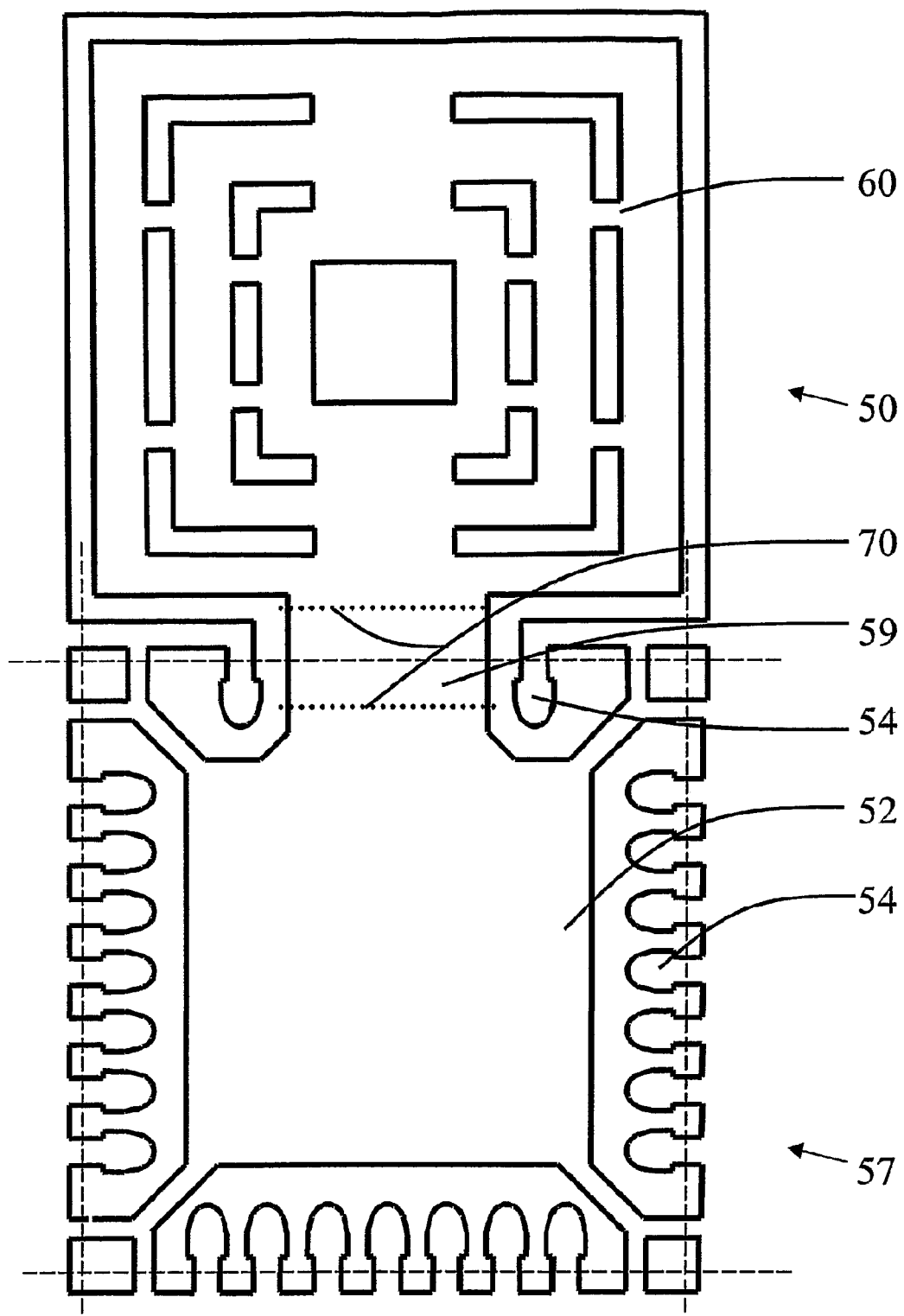
FIG. 9 shows a plan view of a laid flat MLP-type semiconductor mounting according to the present invention having a cover which is defined with apertures.

FIG. 9 shows a plan view of a variation of the mounting 57 for semiconductor package 50 shown in FIG. 6. The cover 60 forms a plurality of apertures. An example, arbitrary, pattern is shown though an alternative pattern could be used. The apertures can be made in the cover 60 as and when required during the assembly process described above by cutting, etching or punching the desired pattern in the cover. The apertures could be made, for example, while the mounting is in an array of the sort shown in FIG. 7, or afterwards, when it has been separated.

Figure 10:
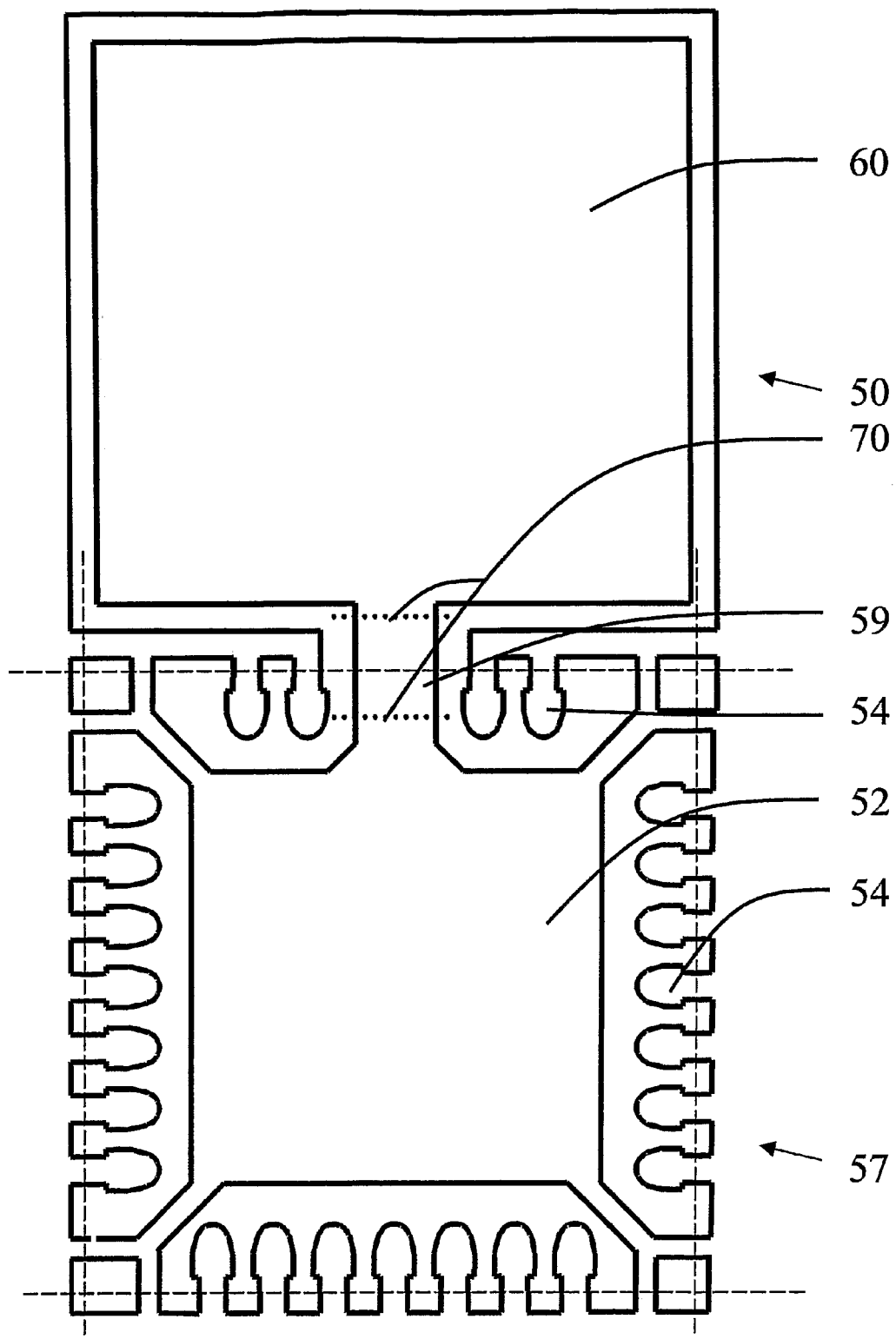
FIG. 10 shows a plan view of a laid flat MLP-type semiconductor mounting according to the present invention having four package connectors on the side adjacent the cover.

FIG. 10 shows a plan view of a variation of the mounting 57 shown in FIG. 6. In this example, there are four pins on the package side where the connecting formation 59 is defined.

Figure 11:
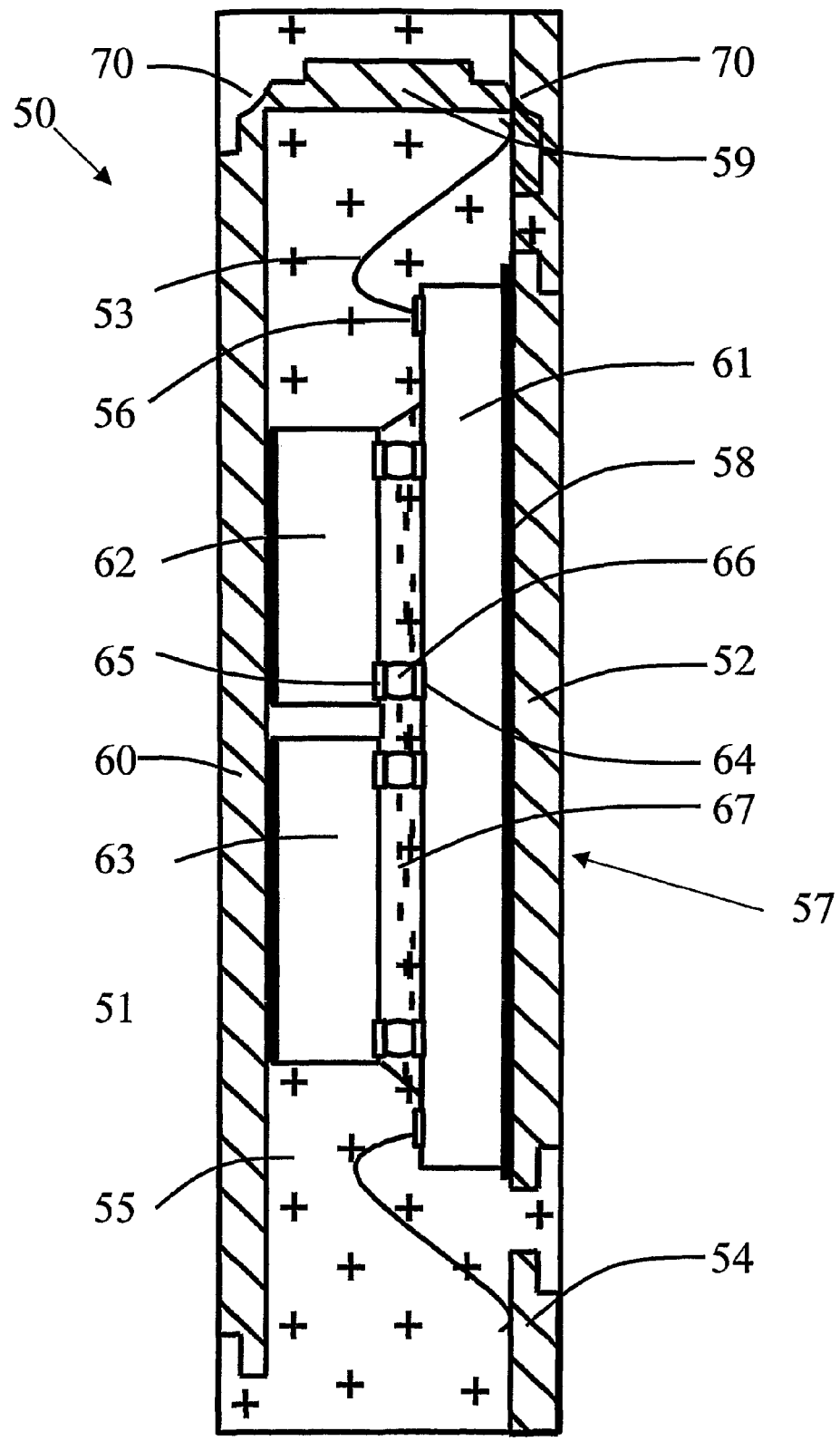
FIG. 11 shows a side elevation, cross-sectional view of a second embodiment of a semiconductor package according to the present invention.

FIG. 11 shows a side-elevation, cross-sectional view of a second embodiment of a semiconductor package 50 according to the invention. In this embodiment, multiple semiconductor chips are integrated. There is a single mother semiconductor chip 61 and two inverted chips 62, 63 mounted on the mother semiconductor chip 61. The larger mother semiconductor chip 61 may be mounted first to the base support 52. The top surface of the semiconductor chip 61, is specifically designed to have corresponding connection pads 64 upon which to mount a plurality of smaller daughter chips 62, 63.

Modern "flip-chip" assembly techniques are used to mount the daughter chips 62, 63 upon the upper surface of the mother semiconductor chip 61.

The daughter semiconductor chips 62, 63 are pre-thinned and prefabricated, perhaps at wafer level, with materials to form a plurality of "bumps" to facilitate the flip-chip connection. Singular bumps 66 are positioned at each of the connection pads 65 of the daughter die 62, 63. Popular methods of bumping semiconductor chips are, solder deposition/reflow or gold stud. Alternative attachment materials include anisotropic conducting materials.

Under-fill material 67 may be added between the mother and daughter chips to improve reliability and thermal performance of the flip-chip bonds 66. Some types of under-fill material 67 can be applied to the flip-chip stack either before or after the placement is made.

The direct connection of electrical, and mechanical path from the daughter chips 62, 63 to the cover 60 will aid thermal and electrical performance. The exposed cover 60 will aid heat dissipation.

In this example the mother chip 61 is mounted on the base 52 using the techniques described above. Additional connection pads 64 can be fixed at the desired points on the mother chip 61 and solder bumped chips can be located on the mother chip and reflow soldered. The assembly can be cleaned if necessary to remove any debris from the reflow process. If desired, the space between the daughter chips 62 and the mother chip 61 can be filled using standard underfill techniques and materials.

Alternative flip-chip techniques can be employed, such as thermocompression bonding, thermosonic bonding and using conductive adhesives.

An alternative substrate material such as flex, pcb, ceramic or glass may also be used in place of the described mother semiconductor chip 61.

Figure 12:
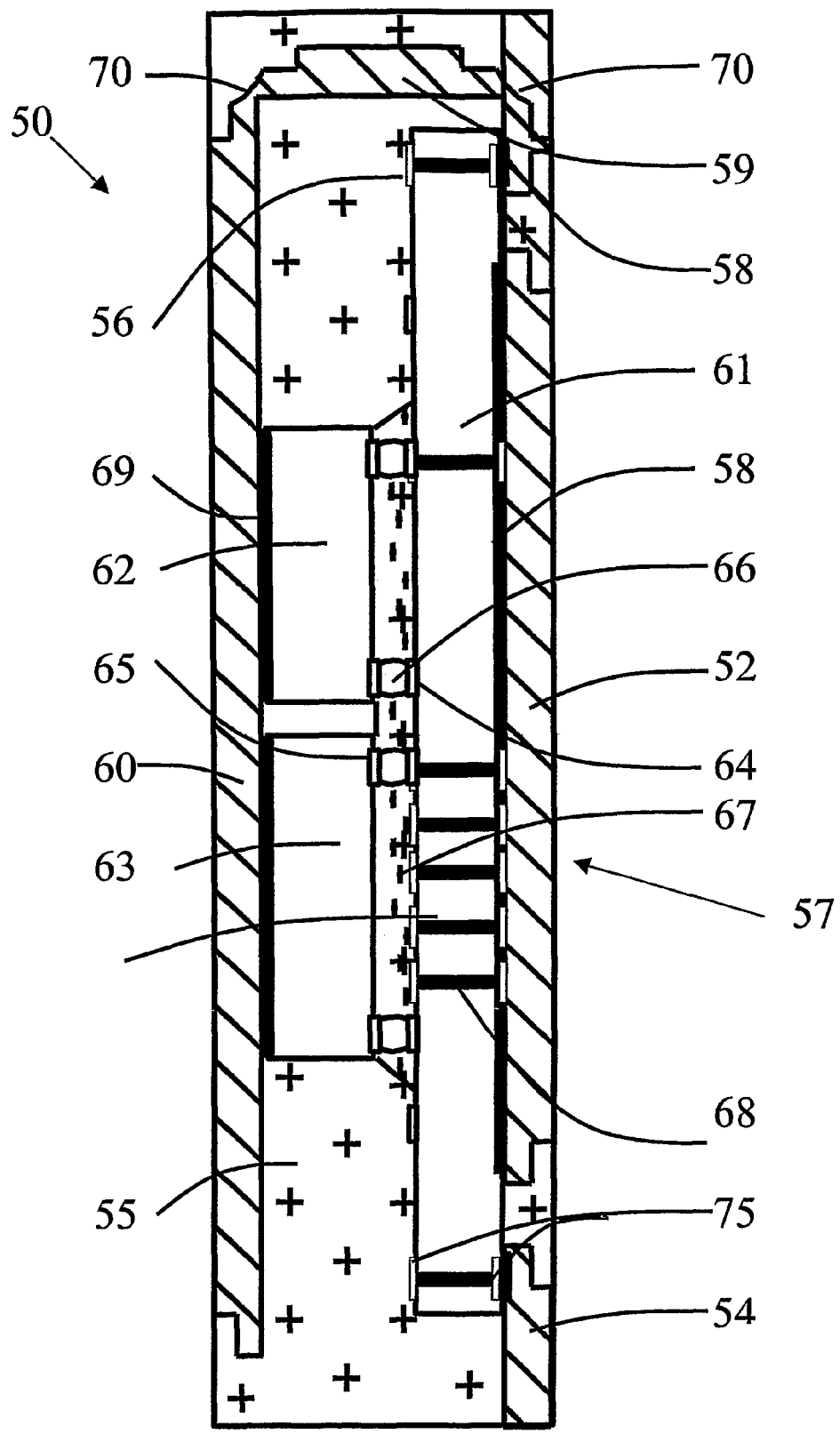
FIG. 12 shows a side elevation, cross-sectional view of a third embodiment of a semiconductor package constructed in accordance with the principles of the present invention.
Figure 13:
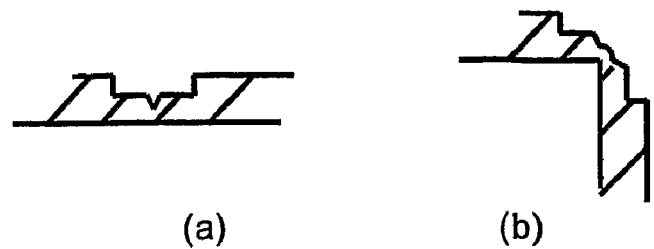
FIG. 13 shows a side elevation, cross-sectional view of the construction of a single bend point.
Figure 14:
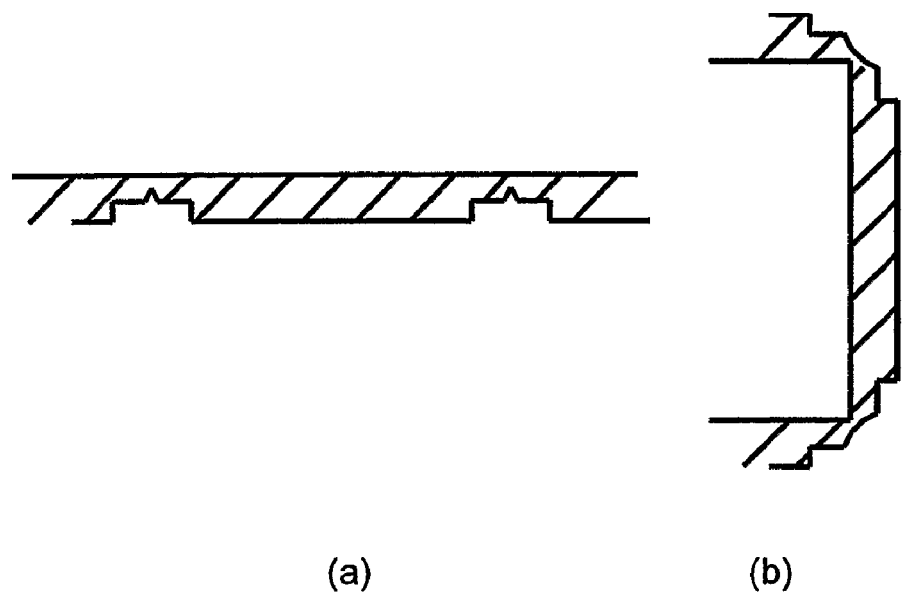
FIG. 14 shows how a pair of bend points may be used to construct the connecting formation used in the present invention.

FIG. 12 shows a side-elevation, cross-sectional view of a third embodiment of a semiconductor package 50. In this embodiment, as in the second embodiment shown in FIG. 11, multiple semiconductor chips are integrated. The plurality of wires 53 in the second embodiment are replaced with through-hole vias 68 in the mother semiconductor chip 61.

The mother semiconductor chip 61 is designed with through-hole vias 68 with upper and lower capture pads 75, which facilitate a vertical connection through to the base of the chip 61. The through-hole via 68 and capture pads 75 may be designed to align and allow connection directly with the package connectors 54 and/or base support 52. Multiple through-hole vias 68 may be arrayed to improve electrical connection or thermal relief. Conductive epoxy or solder material 58 is pre-deposited upon the plurality of package connectors 54. This deposition of a conductive layer or solder 58 is made at the same time as the deposition of epoxy or solder material on the base support 52. Upon placement of the mother semiconductor chip 61 a desired electrical connection between the underside of the mother semiconductor chip 61 and package connectors 54 and/or base support 52 is formed.

An alternative substrate material such as flex, pcb, ceramic or glass may also be used in place of the described mother semiconductor chip 61.

FIG. 13(a) shows a side-elevation, cross-sectional view of a defined bend line 70 in the mounting metal foil. Processes of etching and scribing are used to define a particular cross-section within the mounting metal foil which will provide a repeatable, reliable and robust mechanism for bending of the mounting to form the connecting formation 59 and cover 60.

FIG. 13(b) shows a side-elevation, cross-sectional view of the same single defined bend line 70 in the mounting metal foil after being formed to an angle of 90 degrees.

FIG. 14(a) shows a side-elevation, cross-sectional view of two defined bend line 70 in the mounting metal foil. The bend points 70 are defined at a distance specific and relating to the desired height of connecting formation 59 and separation from base support 52 and cover 60. Processes of etching and/or scribing are used to define a particular cross-section within the mounting metal foil which will provide a repeatable, reliable and robust mechanism for bending of the mounting to form the connecting formation 59 and cover 60.

FIG. 14(b) shows a side-elevation, cross-sectional view of same two defined bend line 70 in the mounting metal foil after each is bent through to an angle of 90 degrees.

FIGS. 13(b) and 14(b) show the bend line feature formed by the removal of material from the outer side of the bend. There are advantages to methods of bending with the etched or scribed line 70 on the inner side of the bend. One advantage of this is that it allows greater control over the bending action. This is because the two sides of the etched or scribed line come into contact at a predetermined bending angle and stop the bending at that angle. Angles other than 90 degrees can be used. For example three bends of 60 degrees each could be used.

Figure 15:
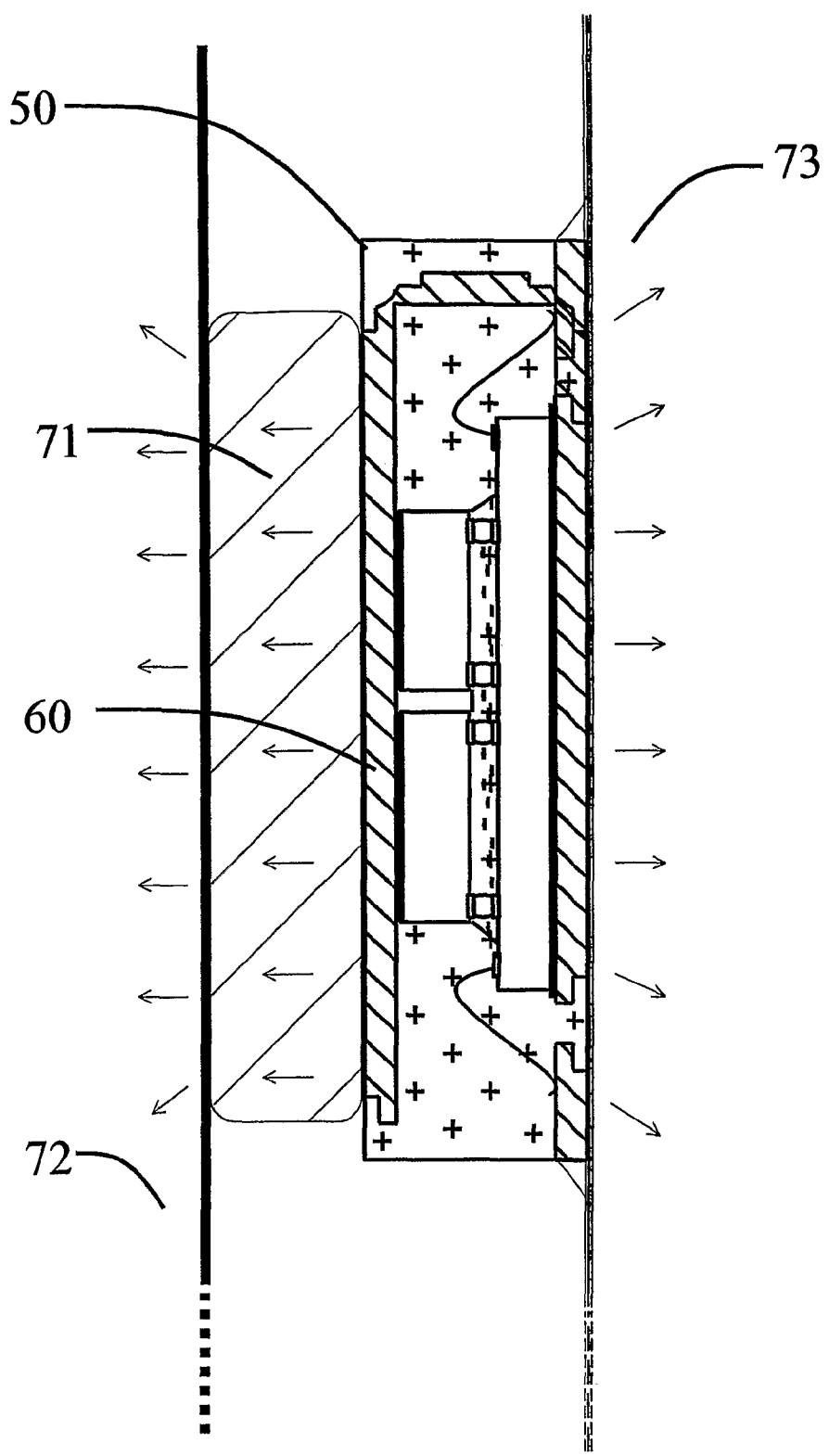
FIG. 15 shows a side-elevation, cross-sectional view of the second embodiment of the present invention mounted on a printed circuit board.

FIG. 15 shows a side-elevation, cross-sectional view of the second embodiment of the present invention, a semiconductor package 50 mounted to a printed circuit board 73. A thermally conductive material 71 is deposited upon the top surface (cover 60) of the package and used to dissipate heat. The thermally conductive material 71 is shown deposited so that it makes contact to a suitable casing or body 72 of the final product. Open arrows depict the general dissipation of heat energy away from the package.

Further embodiments of the invention use flip-chip bonding techniques. Before discussing these further embodiments in detail, the prior art flip-chip-onto-leadframe-pin MLP-type semiconductor package is discussed below.

Figure 16:
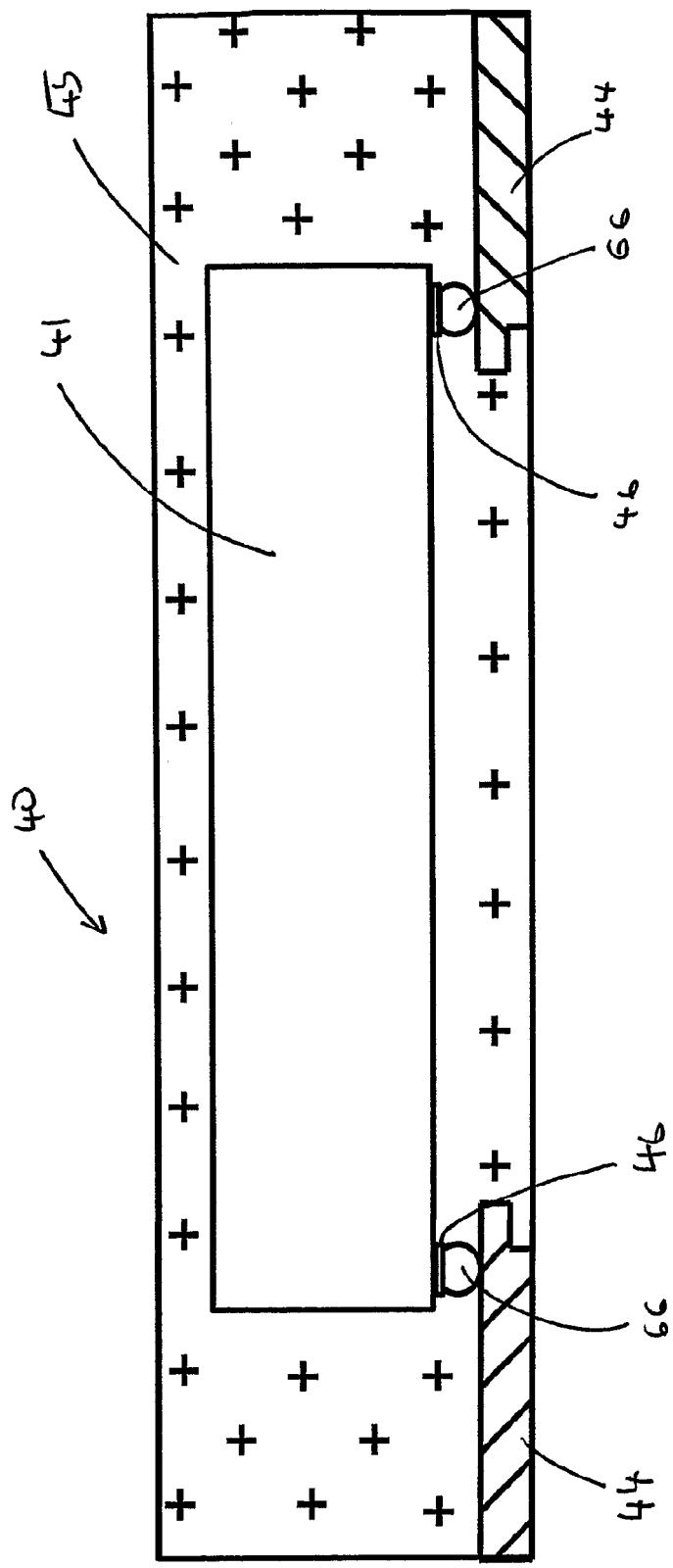
FIG. 16 shows a side elevation, cross-sectional view of a known flip-chip onto leadframe MLP-type package.

FIG. 16 shows a cross-sectional view of a known flip-chip-onto-leadframe-pin MLP package. A top plan view of the same prior art mounting or leadframe for a flip-chip-onto-leadframe-pin QFN package is shown in FIG. 17.

With reference to FIG. 16, here the semiconductor die has been "bumped" using standard techniques to provide physical and electrically conductive connection to each of its signal pads. As previously mentioned above, popular methods of implementing the conductive bumps 66 are by gold stud, deposited and reflowed solder or deposited conductive column structures. The die has then been flipped over and mounted directly to the leadframe package pins using recognised methods. The package is moulded and diced using standard processes.

Figure 17:
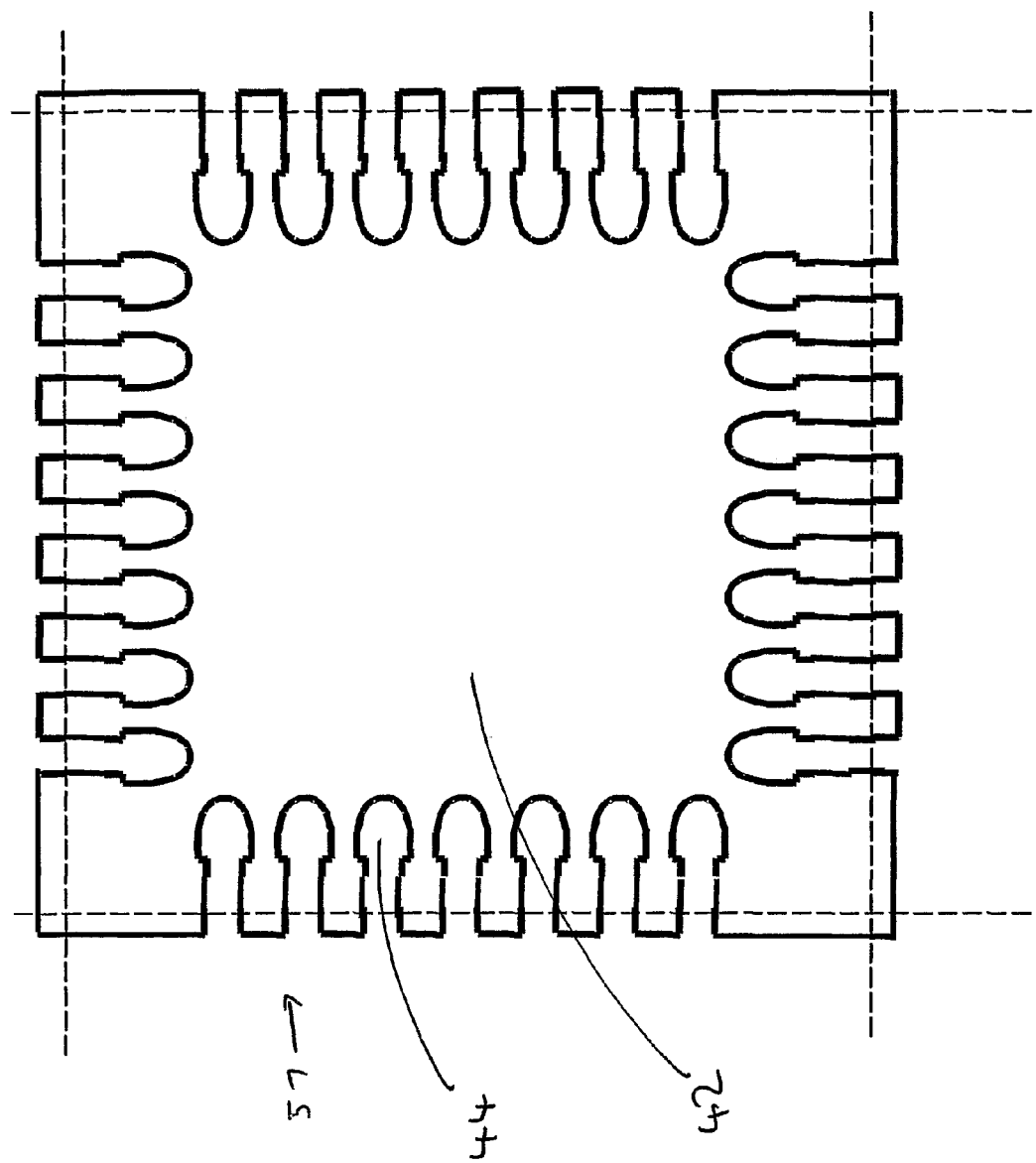
FIG. 17 shows a top plan view of a mounting used to make the package of FIG. 16.

With reference to FIG. 17, the mounting 7 is designed with elongated peripheral pins making the desired connection from package edge to underneath the semiconductor die.

In this type of "flip-chip-onto-leadframe-pin" MLP package, the base die mounting pad used in wirebonded QFN packages is often removed to allow the inward extension of the peripheral package signal pads under the die. This also improves access for mould material.

Although not shown, it is also possible to have a base pad present allowing multiple connections under the chip. Thermal performance is improved through such an array of bumps connecting to this pad.

FIGS. 18 to 22 illustrate further aspects of the invention applied particularly to flip-chip mounting in packages. Like numerals refer to like features.

Figure 18:
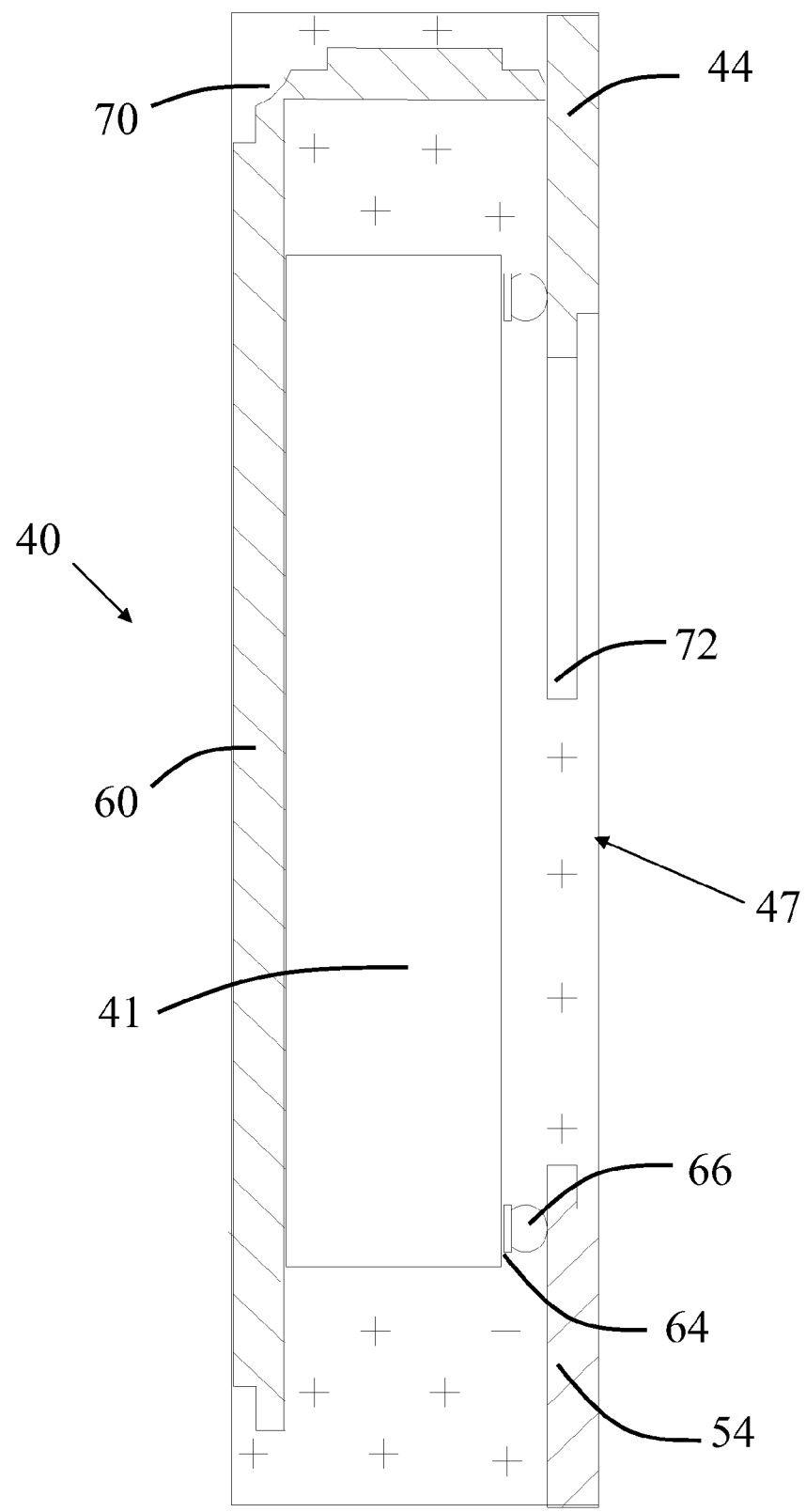
FIG. 18 shows a side elevation, cross-sectional view of a flip-chip onto leadframe MLP-type package according to the invention with a formed upper pad.

With reference to FIG. 18, here is shown a cross-sectional view of an embodiment of a flip-chip-onto leadframe-pin MLP package, according to the invention. A plan view of the mounting design for the embodiment of FIG. 18 is shown in FIG. 19.

Referring to FIG. 18, here, as with the prior art, a pre-bumped semiconductor die 41 has been flipped and mounted onto the base mounting pins 44. Here the embodiment improves upon the prior art by providing an additional, exposed top pad heatsink and EMI shield. The top metal pad 60 is formed and attached to the back of the die 41 using standard materials such as solder paste or conductive adhesives. The side view of a half-etched support structure 72 is shown extending and anchoring the top pad and pins. This can be seen more clearly in FIG. 19.

Figure 19:
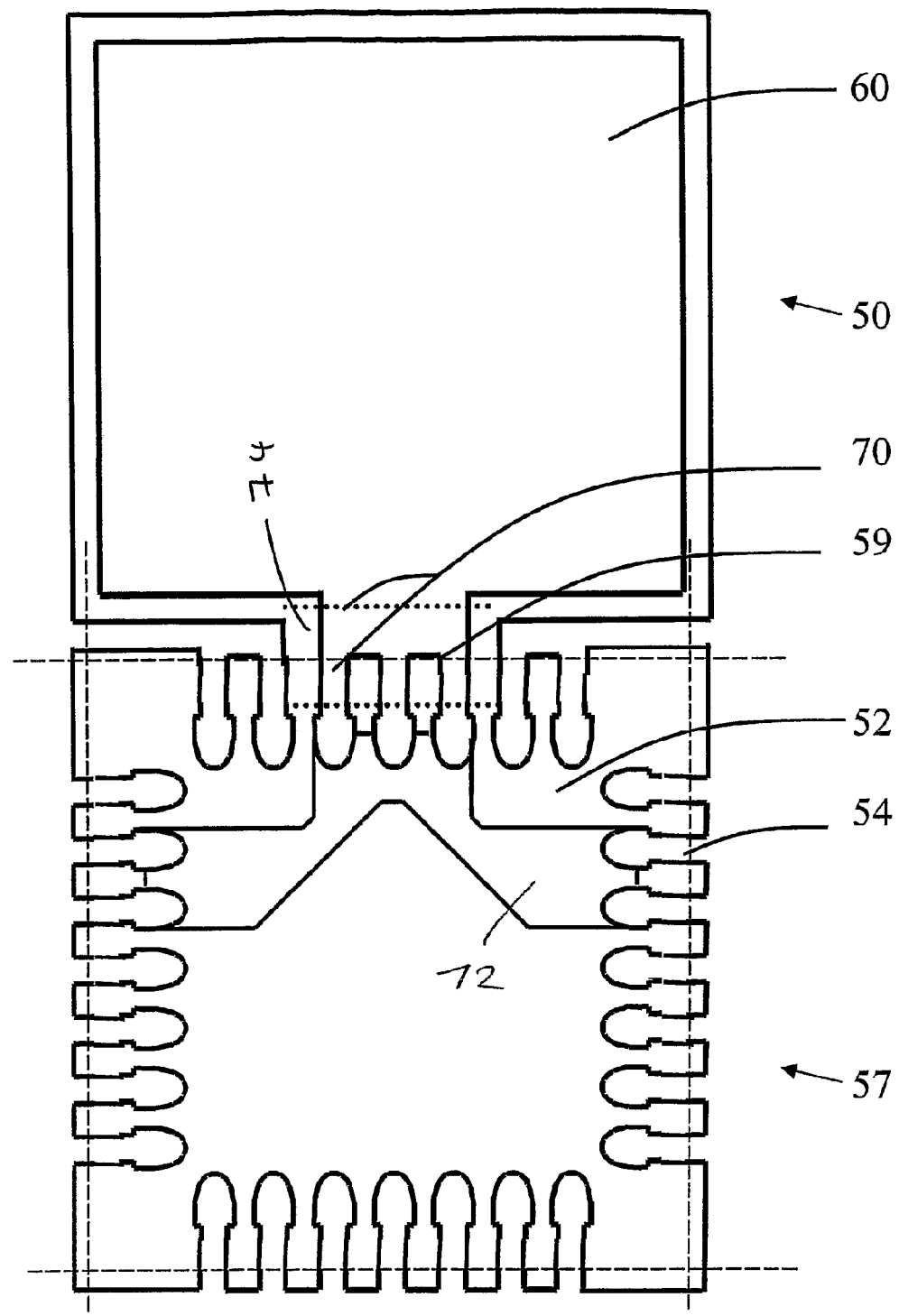
FIG. 19 shows a top plan view of a mounting used to make the package of FIG. 18.

Referring to FIG. 19, the mounting design for the embodiment is shown with the top die pad 60 lying flat. The top pad and bend structures 74 are mechanically supported by mounting material structures.

Figure 20:
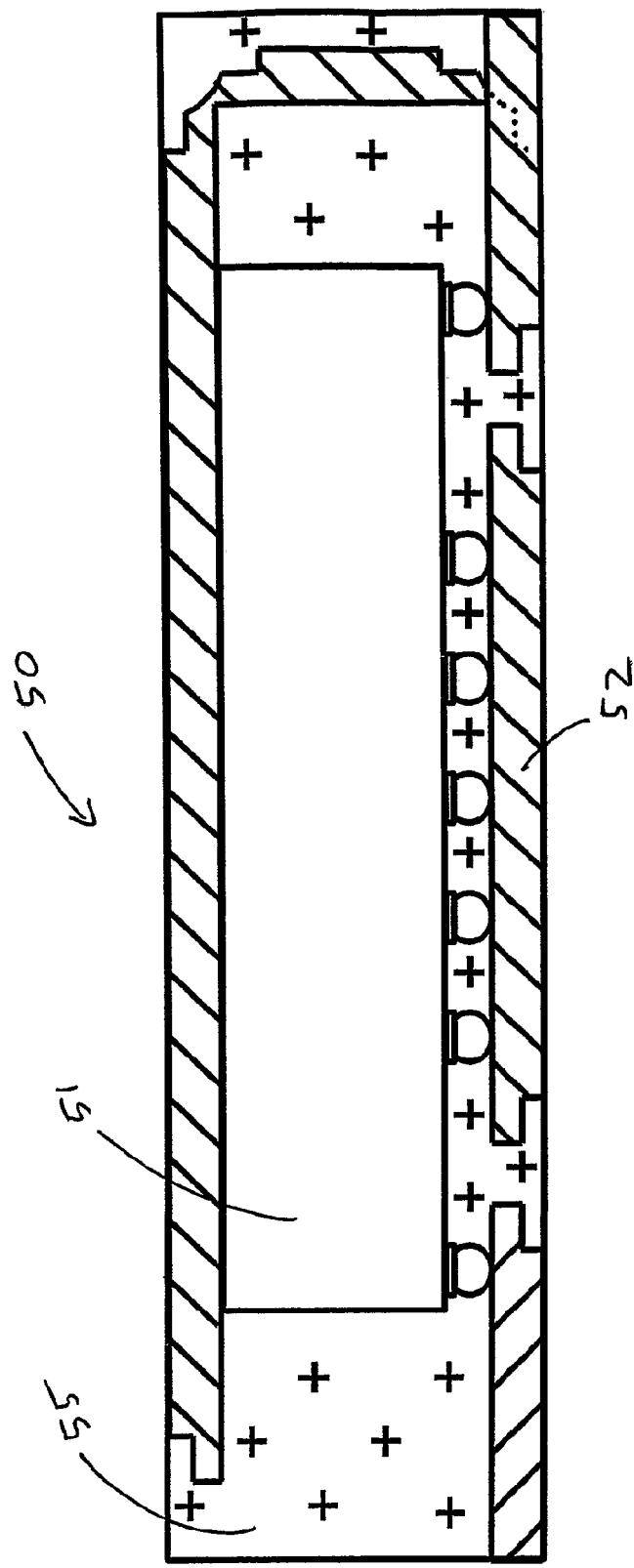
FIG. 20 shows a side elevation, cross-sectional view of a flip-chip onto leadframe MLP-type package according to the invention with a formed upper pad and base pad.

FIG. 20 shows a further embodiment of a flip-chip-onto-leadframe-pin package, where a base pad 52 is present thus enabling multiple die connections under the chip 51. Thermal performance is improved through the flip-chip bumps connecting to this pad.

Figure 21:
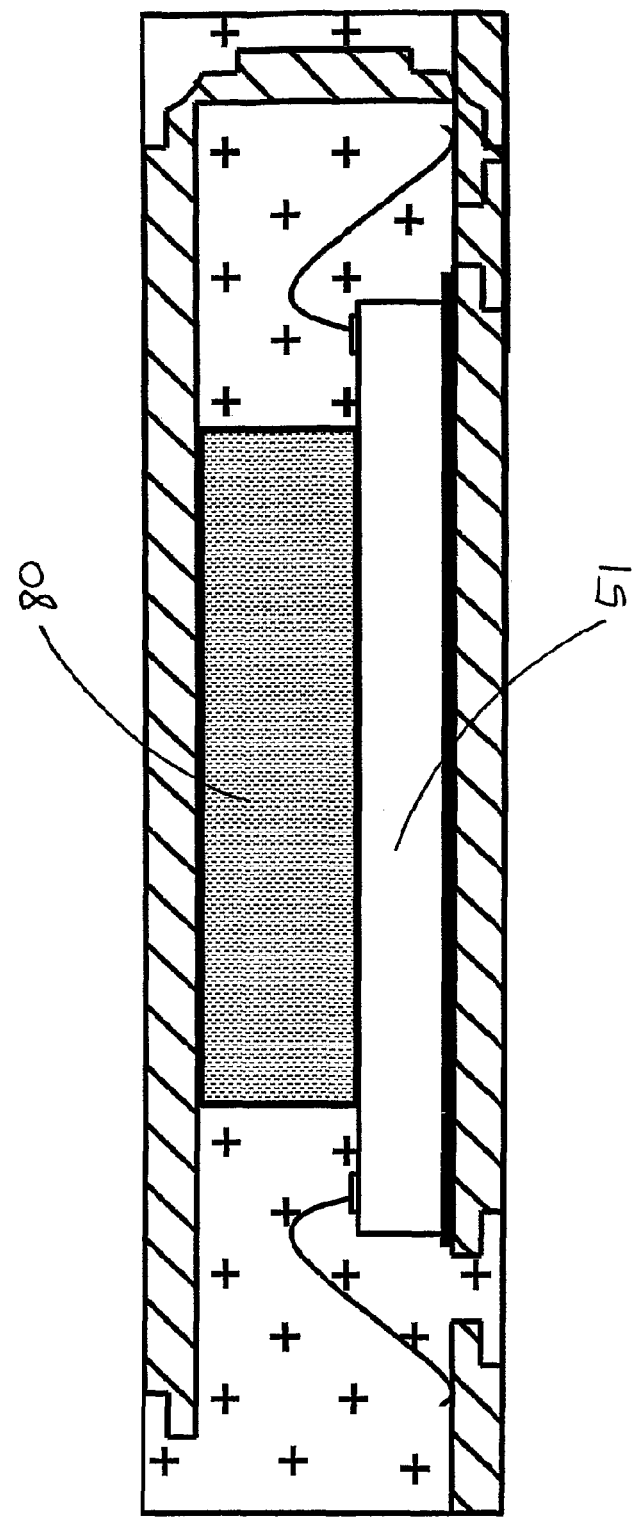
FIG. 21 shows a side elevation, cross-sectional view of an MLP-type package according to the invention with heatsink die enhanced feature.

FIG. 21 shows a side elevation, cross-sectional view of an MLP-type package according to the invention with a heatsink die. This embodiment is intended for use where extra thermal dissipation is required.

The embodiment shown in FIG. 21 has an additional "die" 80 of thermally conductive material mounted upon the surface of the semiconductor die 51. A thermally conductive adhesive can be used to fix the thermally conductive material to the surface of the semiconductor chip 51. The thermally conductive material could be a diced piece of metal, such as copper, or a non-electrically conducting elastomeric material. The thermally conductive material may also be placed upon the upper face of the top pad, while flat and prior to leadframe bending. A half-etch recess (not shown) may also be defined to aid alignment of the thermally conductive die.

In the example shown, the process for assembling the package is substantially the same as described for other embodiments, but with the additional step of placing the die 80 onto the chip 51 before the cover is folded over. Thermal performance is thereby improved by providing a low thermally resistive path to the top and bottom package boundaries.

This method is particularly suitable for medium to large sized die where there is sufficient surface area to safely mount the die of thermally conductive material without disrupting peripheral wirebonds.

Figure 22:
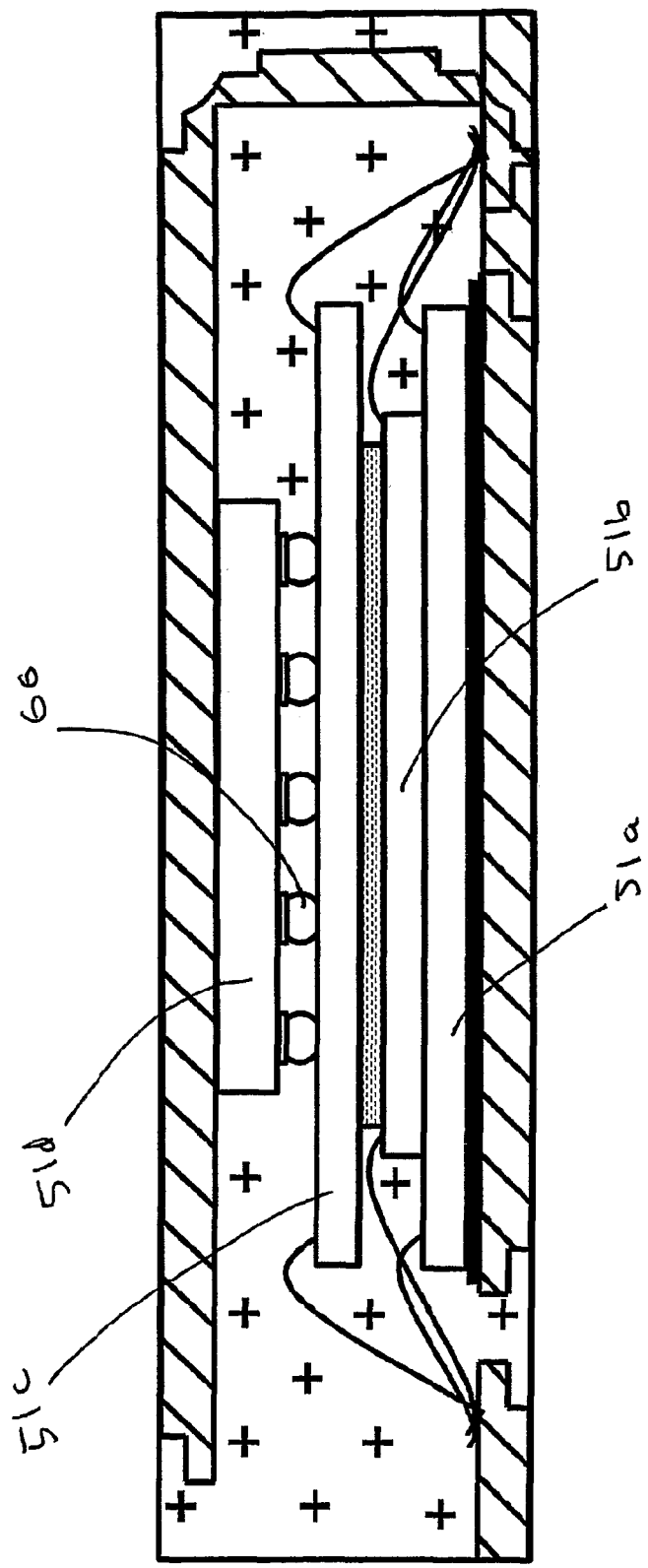
FIG. 22 shows a side elevation, cross-sectional view of an MLP-type package according to the invention with stacked die.

As previously shown in and discussed for FIG. 11, die may be stacked. FIG. 22 shows a further embodiment of the invention where multiple (four-shown) semiconductor die 51a-d have been stacked using a combination of standard assembly techniques such as flip-chip and wirebond. FIG. 22 shows a cross-section dissecting the package centre. The package provides both a thermally enhanced and EMI screened MLP packaging solution for multiple chips. The top die 51d (flip-chip mounted) has a direct connection the package's top metal pad thus providing an excellent route to dissipate heat away from the die stack.

This type of package can be assembled in the same manner as for a single chip package but with the following additional steps. After the first chip 51a has been mounted a variety of techniques can be used to mount the other chips, including thinned die, thinned die attach and spacing methods, and low-profile wire bonding techniques. The additional chips can stacked face up and wire bonded, as for 51b and 51c. The chips can also be flip-chip mounted as detailed above. The chips may be wire bonded onto a common package, as shown here, or wire bonded die-to-die. Edge connectors (not shown) can also be used to connect multiple dies to a common mounting. Vias in the chips could also be used to provide interconnection.

The finished leadframe package can itself be stacked.

Further aspects of the invention incorporate surface mount technology (SMT) and passive components into the MLP package.

Figure 23:
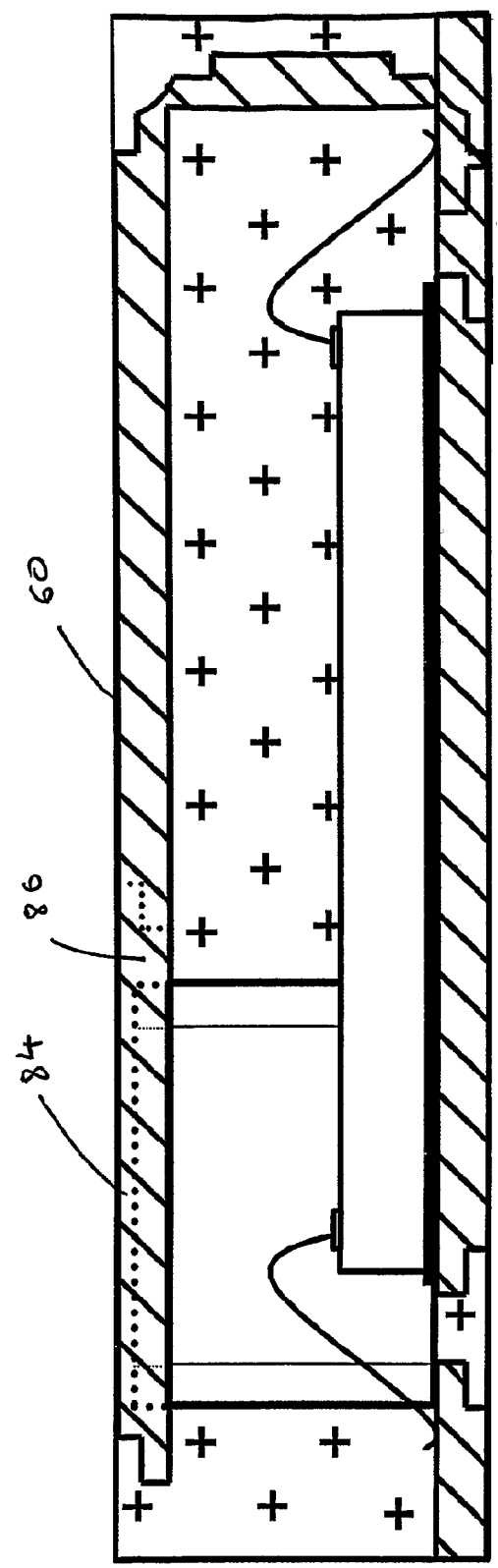
FIG. 23 shows a side elevation, cross-sectional view of an MLP-type package according to the invention with integrated surface mounted (SMT) passive components.

FIG. 23 shows a side elevation, cross-sectional view of an MLP-type package according to the invention with integrated SMT passive components, in this example a leadframe based System-in-Package (SiP) solution. As discussed above the MLP package can be equipped with a top metal pad cover 60. Recesses 84, here indicated by a dotted line, can be defined in the cover. The recess can extend the cover to provide a connection to the SMP passive The package is assembled in the manner described above. Discrete components such as surface mount capacitors or resistors are arranged to fit within these recesses. These components may be supportive to the correct function of the semiconductor die. Integrated passive networks can be deployed using, for example, ceramic substrate, GaAs or silicon thin film technology. Such integrated passive networks are often used in filter circuits and other RF applications.

The profile of the recesses 84 cut in the top pad can be varied to provide sufficient depth for the passive components to be fixed in place.

Figure 24:
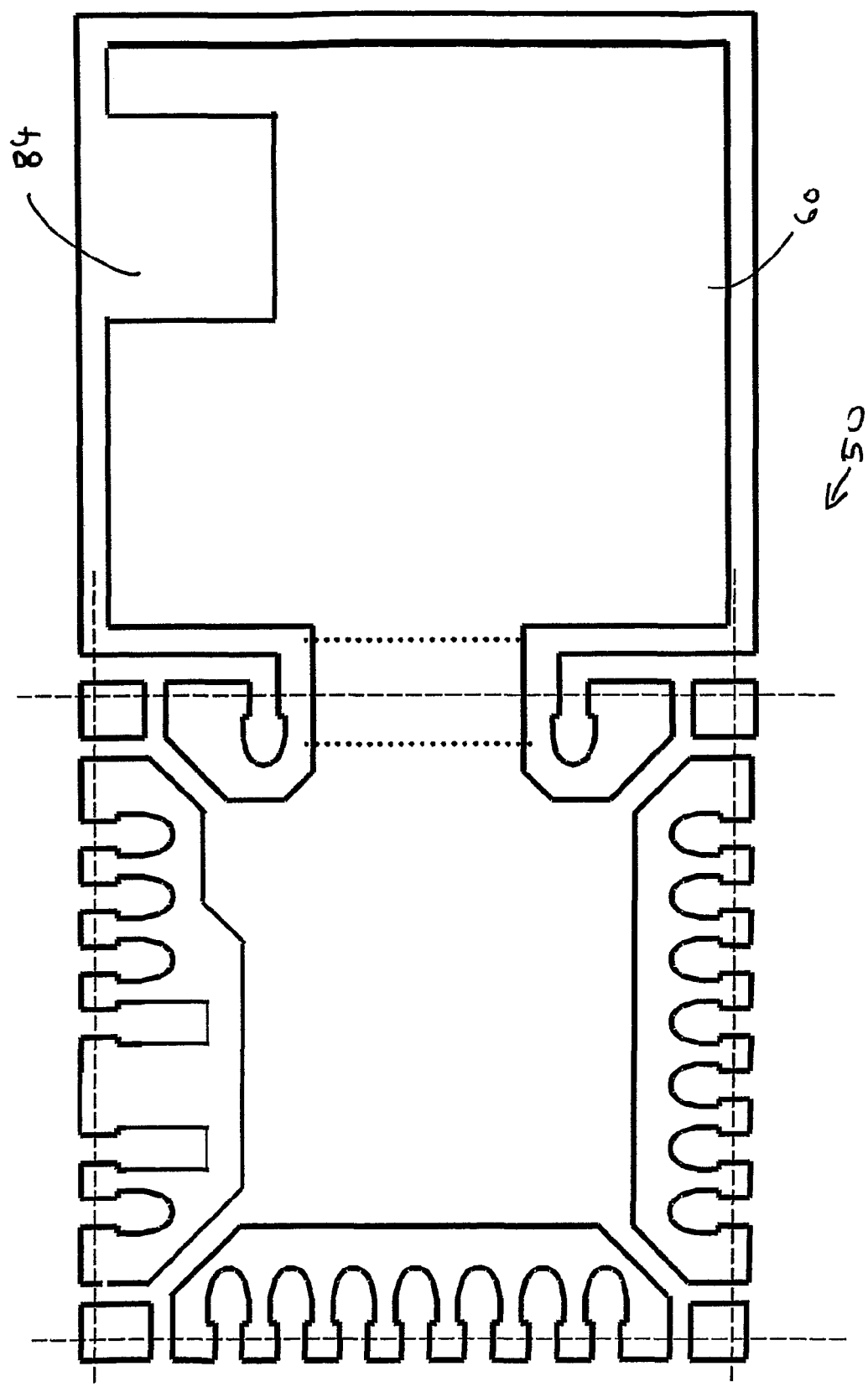
FIG. 24 shows a top plan view of a mounting used to make the package of FIG. 23.

FIG. 24, for example, shows how a recess 84 has been cut in the package's top metal pad, adapting it to give sufficient clearance to allow the larger support components and secondary die to retain the accepted standard height. The embodiment shown can be further modified to form a simultaneous electrical connection to both the package top pad and a bottom signal pin enhancing thermal performance and EMI protection.

Further embodiments of the invention incorporate enhanced EMI features into the MLP package.

Figure 25:
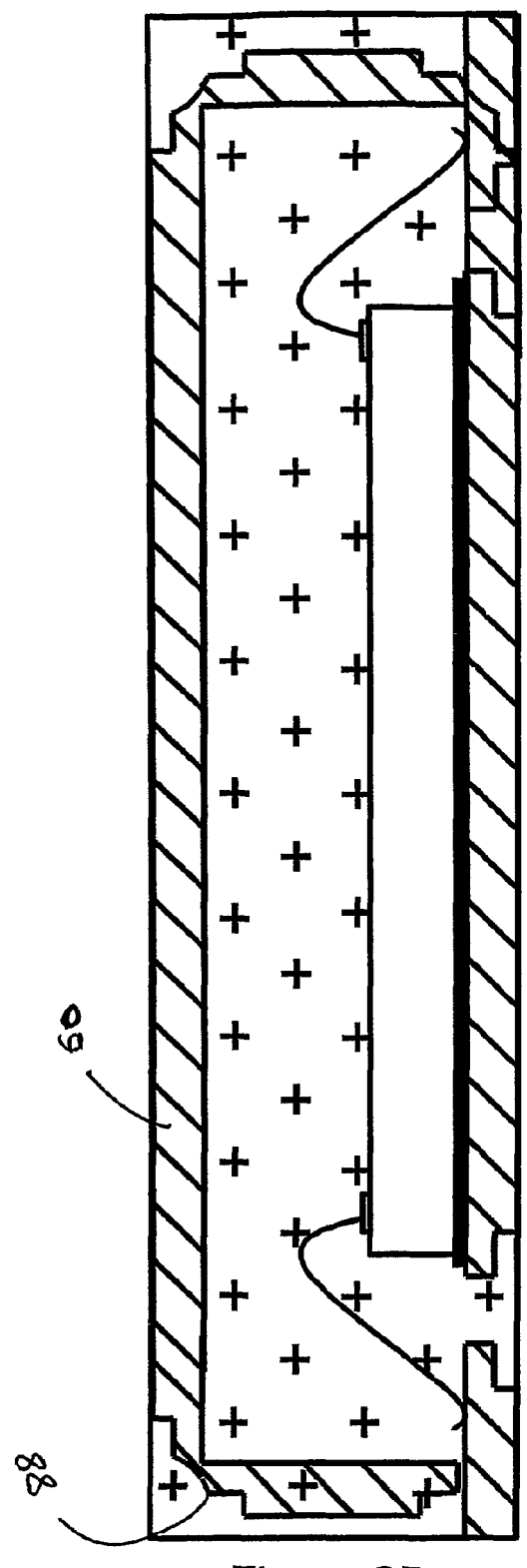
FIG. 25 shows a side elevation, cross-sectional view of an MLP-type package according to the invention with enhanced EMI shielding.
Figure 26:
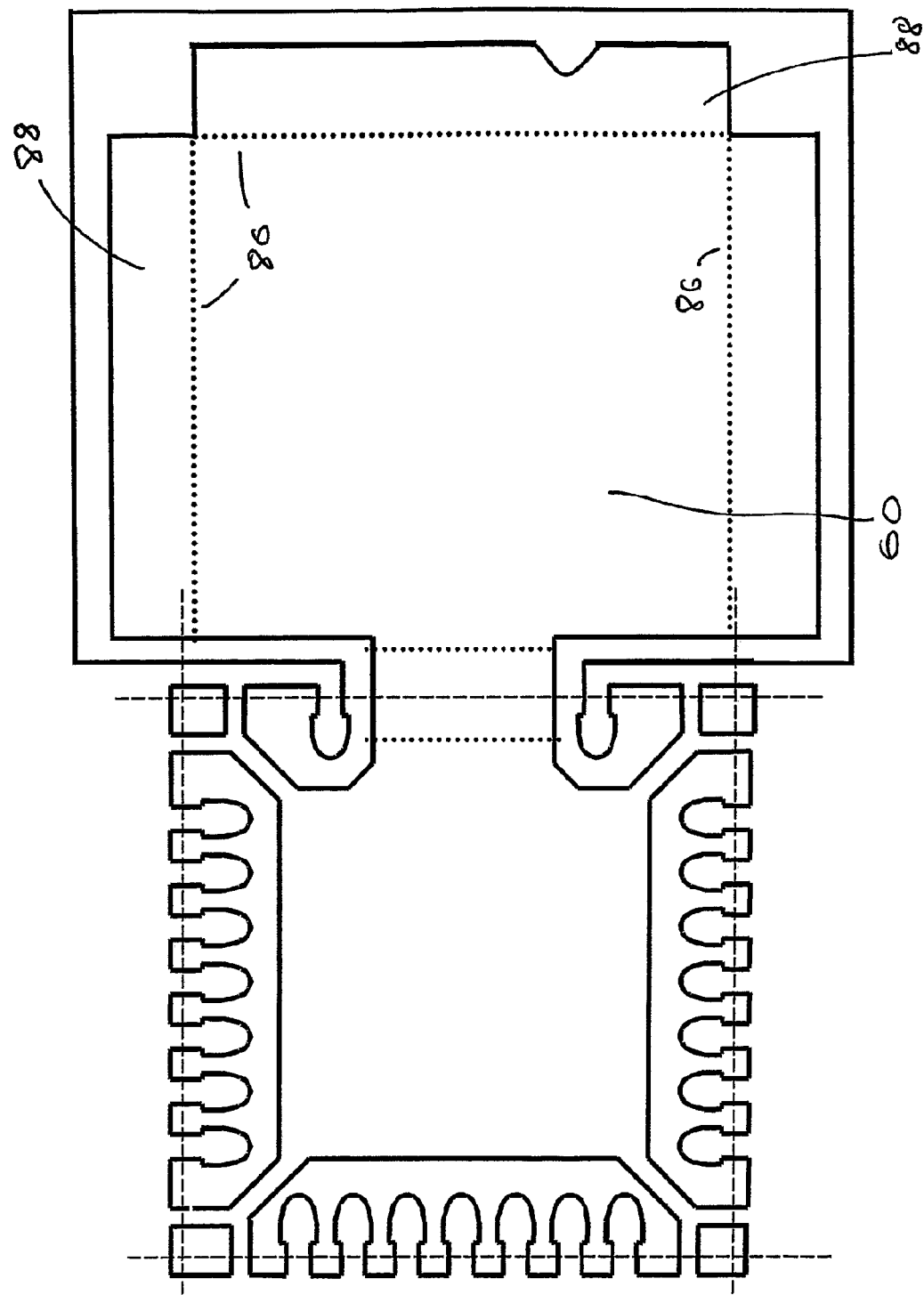
FIG. 26 shows a top plan view of a mounting used to make the package of FIG. 25.

A cross-sectional and plan view of an EMI enhanced package and its mounting are shown respectively in FIGS. 25 and 26. In these examples, the top metal pad 60 has been enlarged and fabricated with additional fold lines 86 using the same process as that used to define the bend points discussed previously, for example for FIGS. 9 and 10.

The fold lines define sidewalls 88. In the embodiment shown in FIGS. 25 and 26, the leadframe top metal pad 60, while still flat, can be shaped by various means, for example a mechanical stamp tool, to form the sides and the base of an up-turned open box. After subassembly, the formed box could, as with the principal embodiment's top metal pad, be bent up and over the mounted die subassembly. The combined box shape and interconnecting vertical structure equipped with the key bend points act as an electrically grounded EMI shield. As shown in FIG. 26, the boxed sidewalls 88 could be designed to maintain clearance or, where contact is required, provide a good electrical connection to the perimeter or centre ground pads of the leadframe base.

With reference to FIG. 26, the larger top pad with defined fold lines is shown lying flat. The final package dimension is indicated by dashed lines. Defined bend points are indicated by dotted lines. Perimeter cut-outs or reliefs can be designed to optimise space around sensitive electrical pins. The top metal pad is equipped with sidewalls 88 which are arranged to allow sufficient access for the plastic mould material.

The assembly of the enhanced EMI protection package shown in FIGS. 25 and 26 follows the same steps as the other packages described above but with an additional step of bending the cover 60 at bend lines 88 to form the sidewalls 88.

FIGS. 27 to 36 illustrate further aspects of the invention featuring an aperture in the MLP package, where it is advantageous to gain access by various means to the surface of the semiconductor chip.

In particular, FIGS. 27 to 34 show embodiments for the packaging of image sensor semiconductor chips 91 for use in imaging systems, for example digital camera applications. Such devices require a window 96 in the package allowing light to fall onto the chip surface. Image sensor chips are equipped with arrays of receptors capable of capturing the light and passing this information as an electrical signal to the system.

The cover 98 is equipped with an aperture to provide a semi-rigid frame or support for the holding and mounting of the glass and/or lens. The package offers an optimised, cheap and low profile solution overcoming many of the assembly issues reported by image sensor manufacturers. For example, correct alignment of components such as lenses in optical systems is important to quality control. Furthermore, assembly of the different components needed to make such an optical system can be intricate and time consuming, increasing manufacturing costs.

Figure 27:
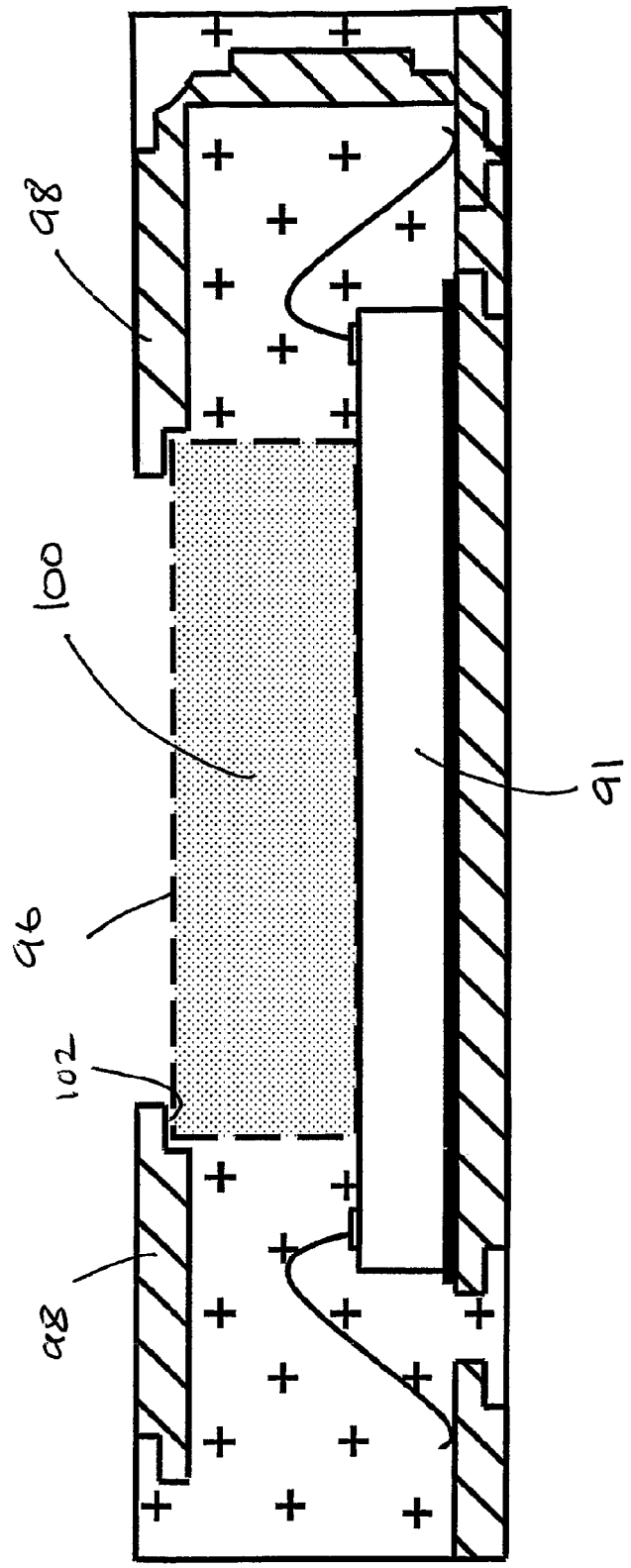
FIG. 27 shows a side elevation, cross-sectional view of an MLP-type package according to the invention with an aperture feature.

FIG. 27 shows a side elevation, cross-sectional view of an MLP-type package according to the invention with an aperture feature. In this example, a "die" 100 of transparent material has been fixed upon the surface of the semiconductor chip using standard assembly techniques. Here a half-etch recess 102 has been used to aid glass die alignment and adhesion. The transparent material could be a cut piece of glass, a pre-shaped lens, a combination of both of these. The package body mould material could also be transparent.

Figure 28:
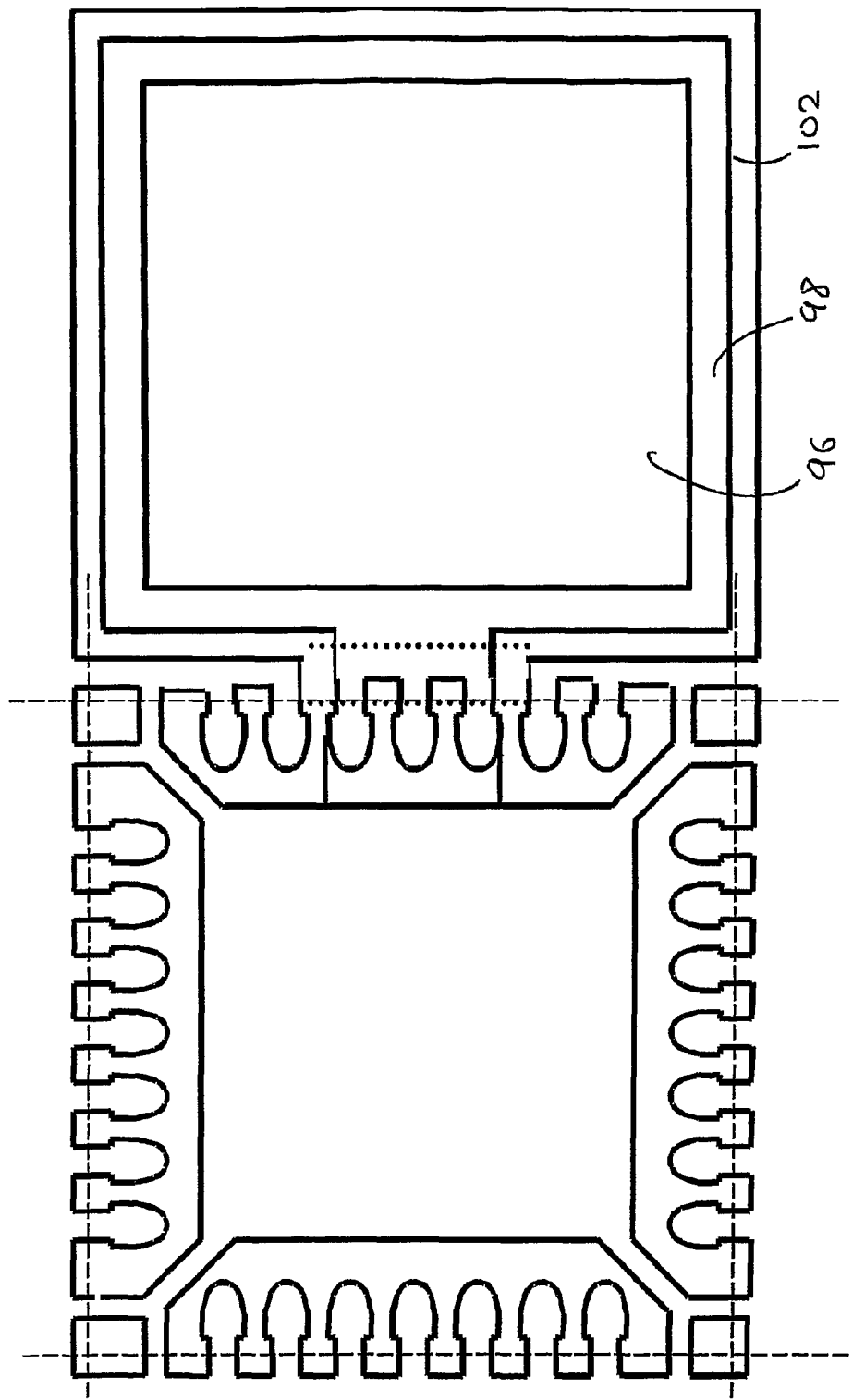
FIG. 28 shows a top plan view of a mounting used to make the package of FIG. 27.
Figure 29:
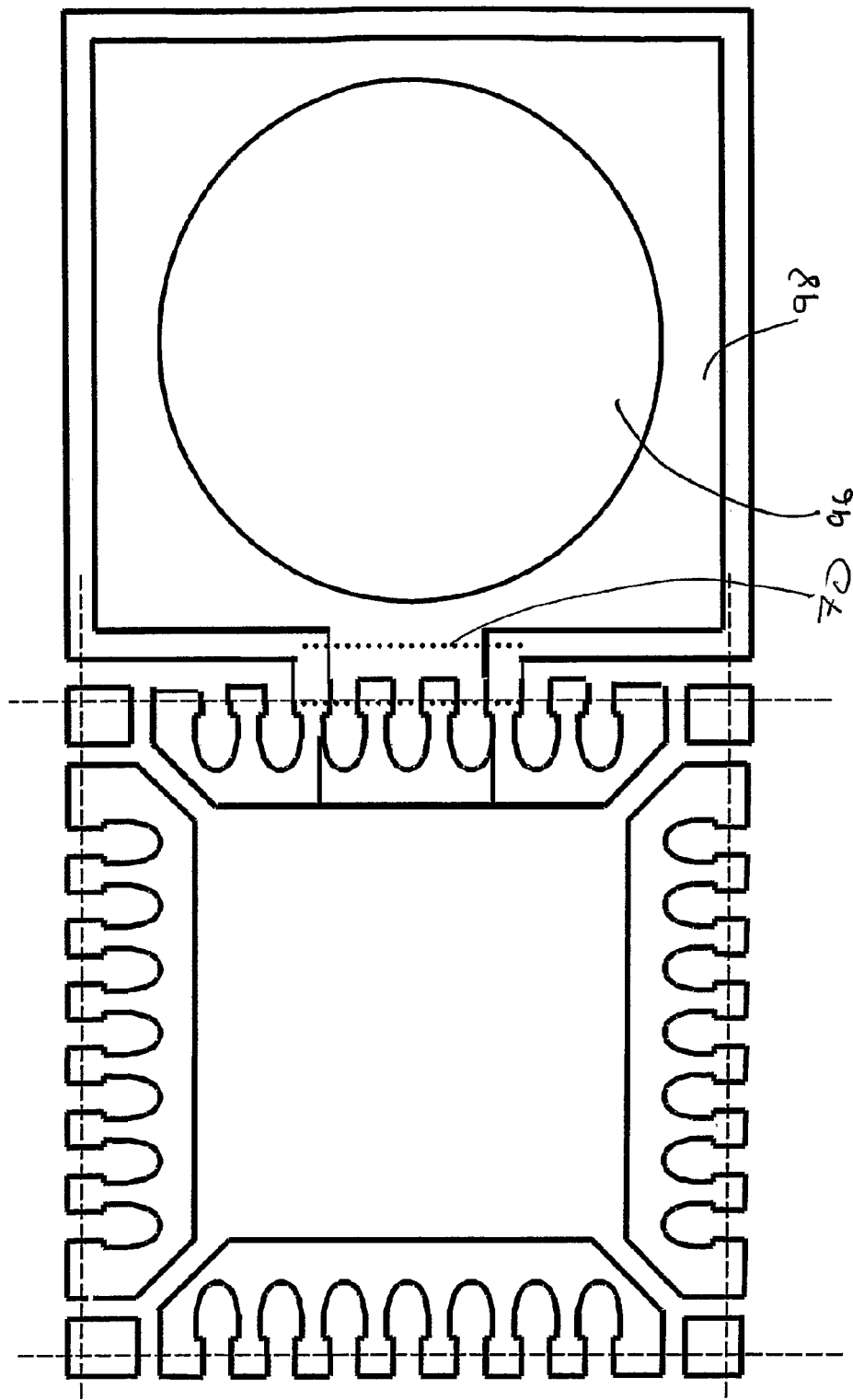
FIG. 29 shows a top plan view of a mounting according to the invention used to make an MLP-type package with a circular aperture feature.

FIGS. 28 and 29 respectively show a square or round "window" 96 could be defined in the top metal pad. If a square glass die (for example IR filter, Borosilicate, or pre-shaped lens) is used it may be placed upon the upper or lower face of the top pad, while flat, and prior to leadframe bending, thus simplifying the assembly process for this type of device.

This type of package construction is particularly suitable for medium-larger sized die where there is sufficient chip area to safely mount the glass die without disrupting peripheral wirebonds.

A transparent epoxy of a similar refractive index to the glass is recommended for fixing the glass to the semiconductor and leadframe surfaces.

Figure 30:
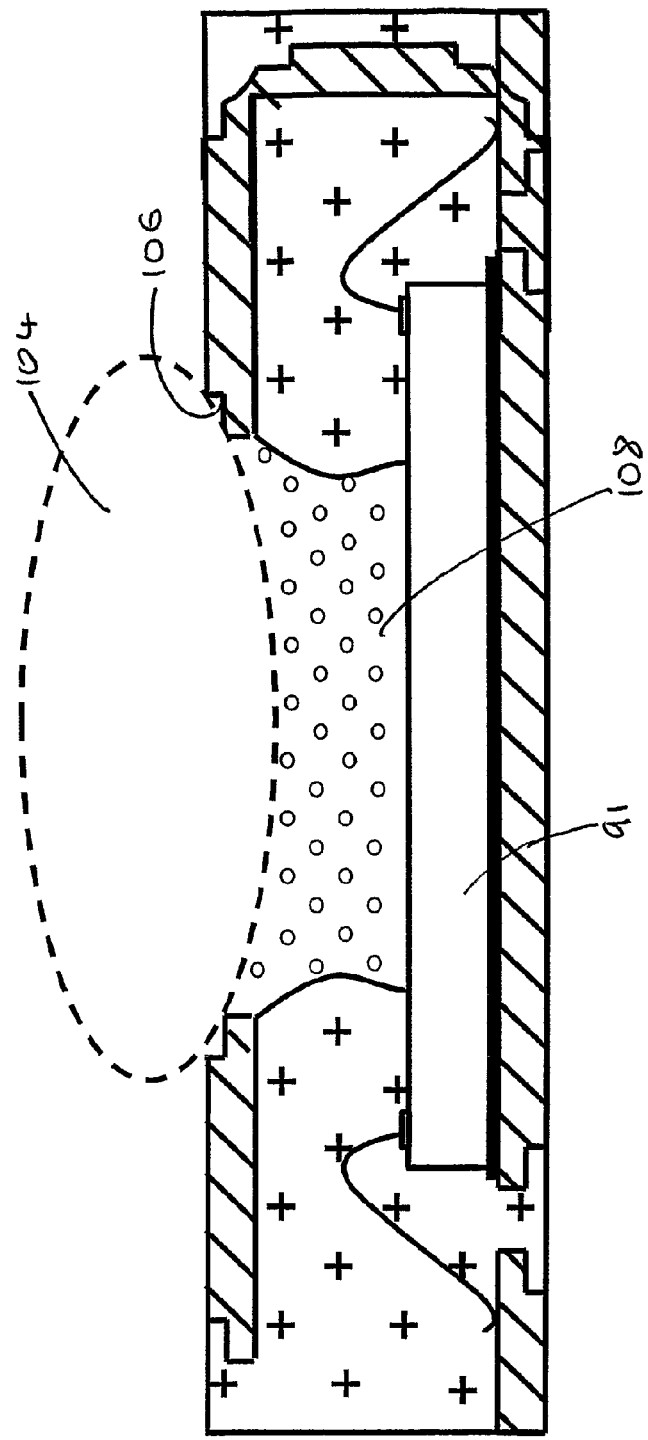
FIG. 30 shows a side elevation, cross-sectional view of an MLP-type package according to the invention with an aperture feature fitted with a lens, made using the mounting of FIG. 29.

FIG. 30 shows a side elevation, cross-sectional view of an MLP-type package according to the invention with an aperture feature fitted with a lens 104. In this example, showing the cross-sectional ellipse of a lens made of transparent material, the lens has been fixed to the outer surface of the top metal pad using standard assembly techniques. A half-etch recess 106 around the aperture has been used to aid lens alignment and adhesion. The space between the lens underside and semiconductor chip surface is filled with a transparent material 108 such as an epoxy.

The semiconductor and lens package can be assembled from a mounting with an aperture in the top pad as follows. A semiconductor chip 91 can be placed on a mounting using the standard techniques described before. The individual mounts are then folded through a nominal angle of 90° along each of the fold lines 70 so that the cover 98 extends over the chip 91, parallel to the base 52 and connectors 54. The transparent material, 108 can be injected to fill the void between the chip 91 and aperture 96.

Alternatively it can be applied to the chip 91 before folding of the mounting. The sealing material 55 is then injected between the cover and the chip 91. The lens 104 is then fixed to the assembly, using the recess 106 to align the lens correctly to the chip 91.

Figure 31:
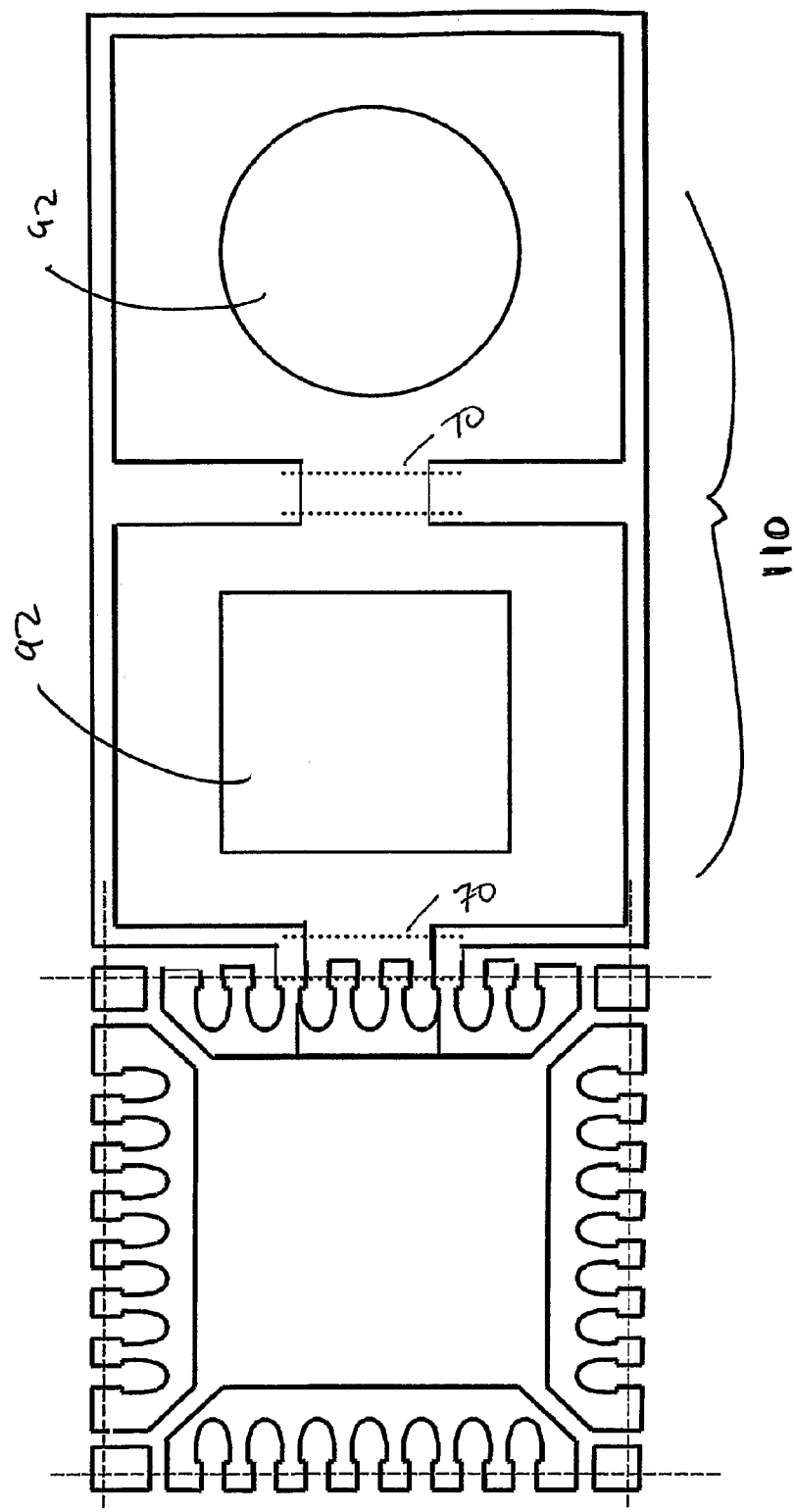
FIG. 31 shows a top plan view of a mounting according to the invention used to make an MLP-type package with a double pad feature and aperture feature.
Figure 32:
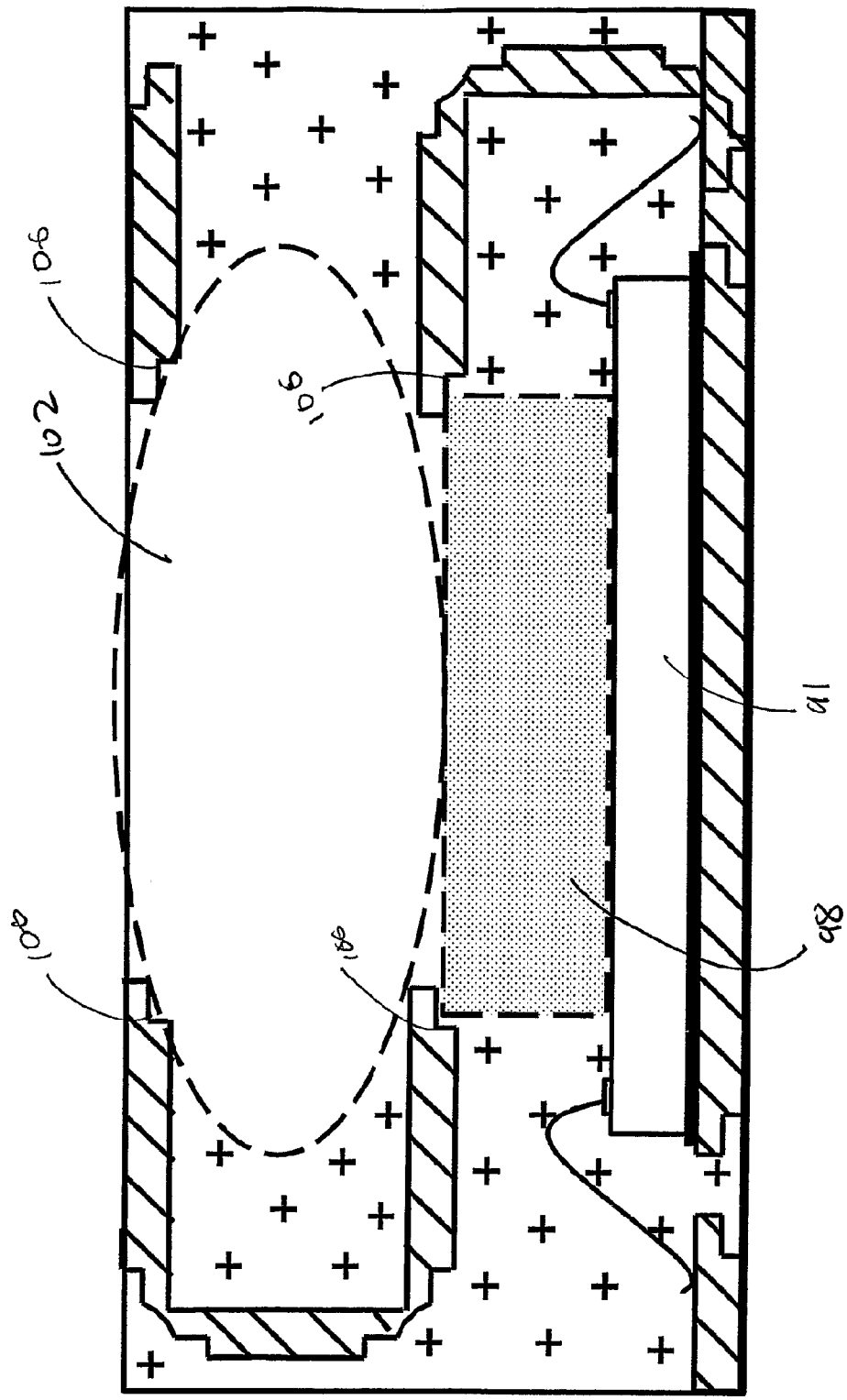
FIG. 32 shows a side elevation, cross-sectional view of an MLP-type package according to the invention with a double pad feature and aperture feature fitted with a lens, made using the mounting of FIG. 31.
Figure 33:
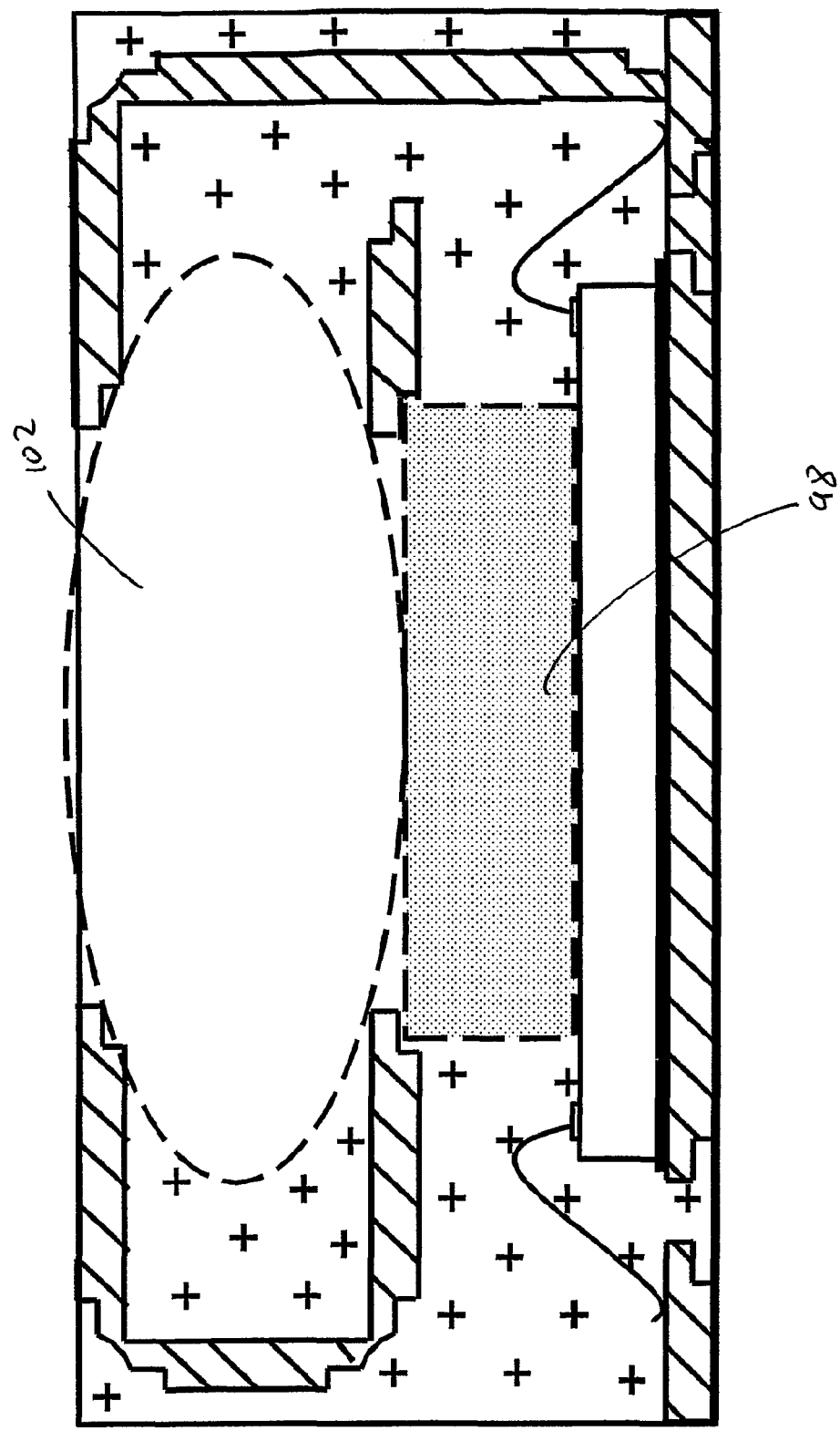
FIG. 33 shows a side elevation, cross-sectional view of an MLP-type package according to the invention with a double pad feature and aperture feature fitted with a lens.

FIG. 31 shows a top plan view of a round "window" 96 can be defined in a double metal pad 110 arrangement. FIGS. 32 and 33 shows how this double pad 110 in the leadframe can be alternatively formed to hold a square glass die 98 and/or pre-shaped (round) lens 102. This general method and form for holding a single square glass die and/or pre-shaped lens may be extended to provide a structure to hold multiple lenses or die. This type of assembly can be used where there is a need for a complex lens/optical system assembly, for example, combining lenses with optical filters.

The packages shown in FIGS. 32 and 33 offer an improved method of assembly. As before, beginning from a flat mounting, for example that shown in FIG. 31, the chip is fixed and connected to the mounting and the square die attached to the chip 91. The lens 102 is placed on the double pad 110, on the round aperture 92. The lens can be secured into place using the recess 106 for alignment. The double pad is folded along fold lines 70 as before, bending a first pad over the chip 91 and die 98 as previously described. The portion holding the lens 102 is then bent back over the first pad such that the lens is held between the first and second top pads. The two apertures in the pad are aligned such that the edges of the aperture of the lower top pad form lower edges to align the lens. This procedure allows the lens assembly to be easily assembled and correctly aligned.

Furthermore, the open aperture type of MLP package can be deployed in sensor applications, for example for use in biometrics applications.

Figure 34:
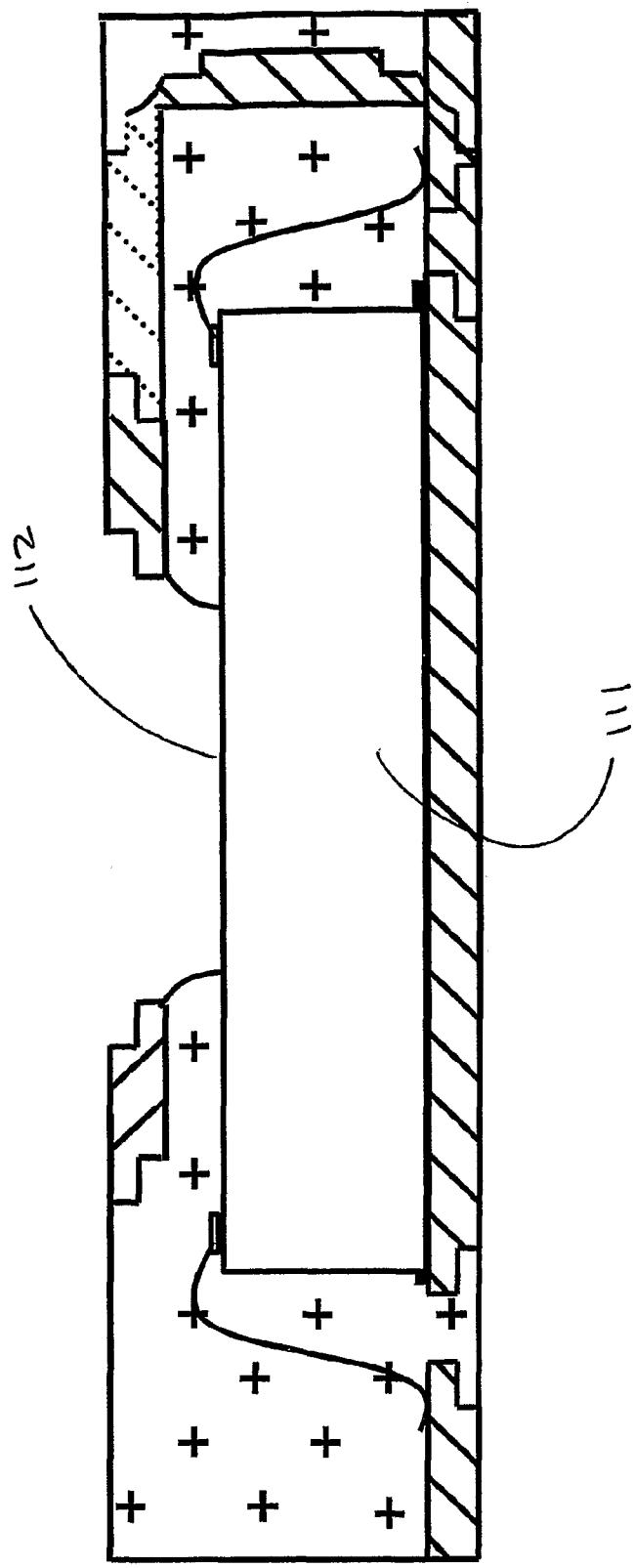
FIG. 34 shows a side elevation, cross-sectional view of an MLP-type package according to the invention with exposed die feature.
Figure 35:
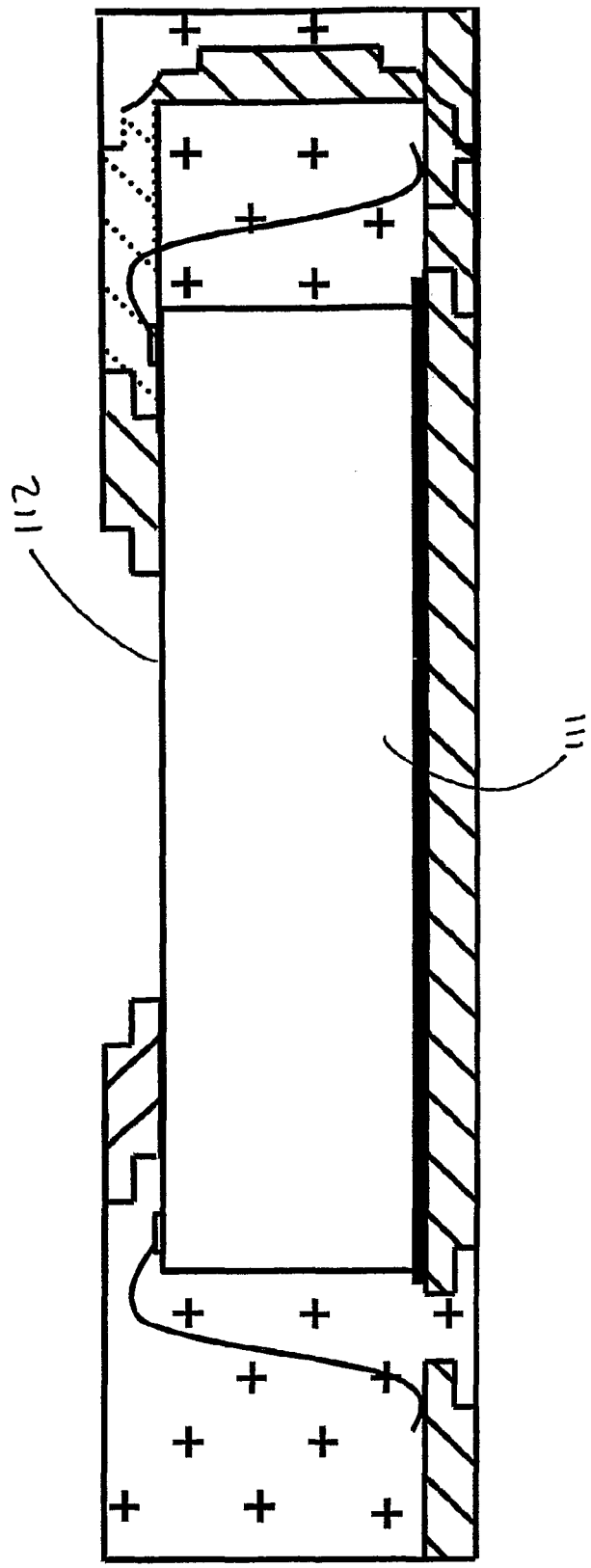
FIG. 35 shows a side elevation, cross-sectional view of a further embodiment of an MLP-type package according to the invention with exposed die feature.

FIGS. 34 and 35 show two such embodiments of the invention for biometrics systems. In FIG. 35 the top metal pad is attached directly to the chip 111 using standard materials and techniques. The top surface 112 of the chip is exposed.

In many biometrics applications the top surface 112 of a protective coated semiconductor chip 111 needs to be exposed to allow an interface with the "real world". An example is a fingerprint identification chip where the user's finger is placed upon the surface of the die.

The frame is designed to fully expose the semiconductor die sensor array without causing disruption to the peripheral wirebonds.

Figure 36:
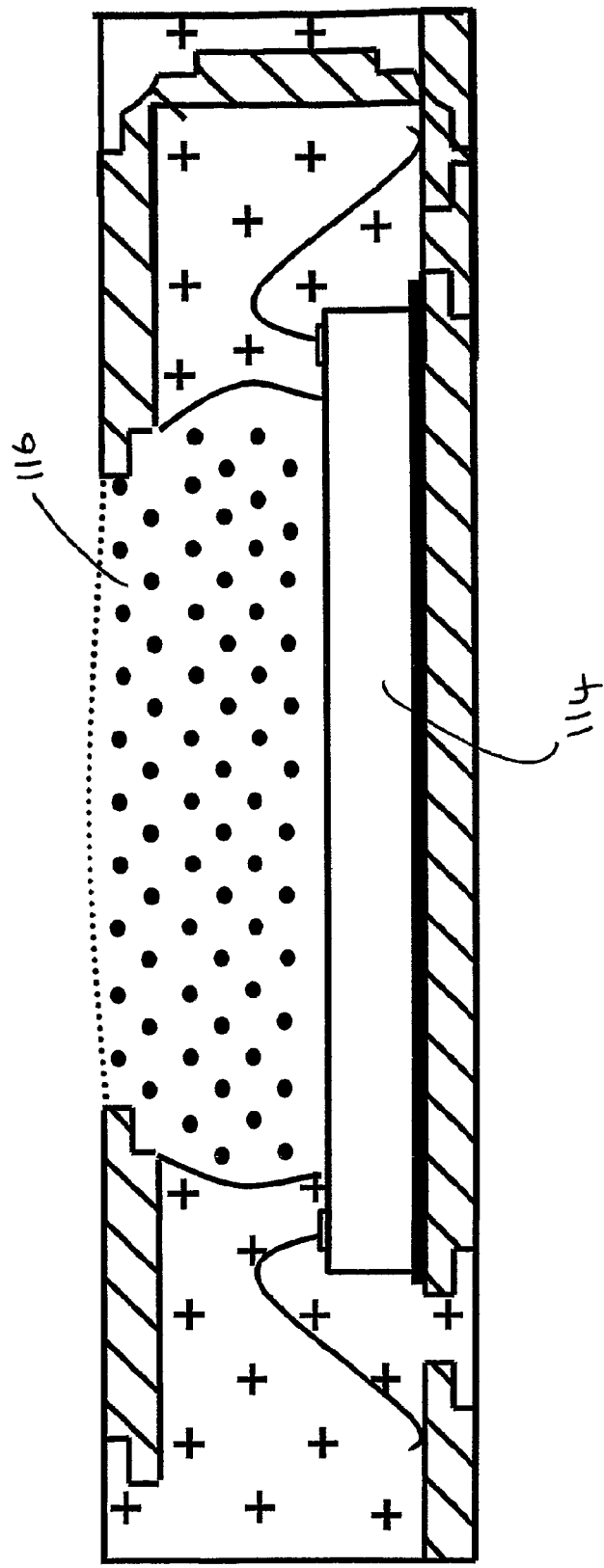
FIG. 36 shows a side elevation, cross-sectional view of an MLP-type package according to the invention with exposed die feature and gel-filled cavity.

An alternative sensor embodiment is shown in FIG. 36. This figure shows a side elevation, cross-sectional view of an MLP-type package with exposed die feature and gel-filled cavity 116. This configuration can be used in, for example, pressure sensing applications. In such a pressure sensor the interface gel material 116 acts as a medium to track environmental pressure changes to the surface of the semiconductor chip. The gel material also acts to protect the sensitive die surface.

The inventions top metal pad is used to provide a supportive frame and desired opening allowing accurate forming of the gel material 116.

The sensor package may be pre or post-moulded using the techniques previously described. The frame and gel window is configured to allow sufficient gel material to access the semiconductor die pressure sensor.

In a further embodiment, the cover of a chip package can be tailored to specific applications and needs, as illustrated in FIGS. 37 to 43.

Figure 37:
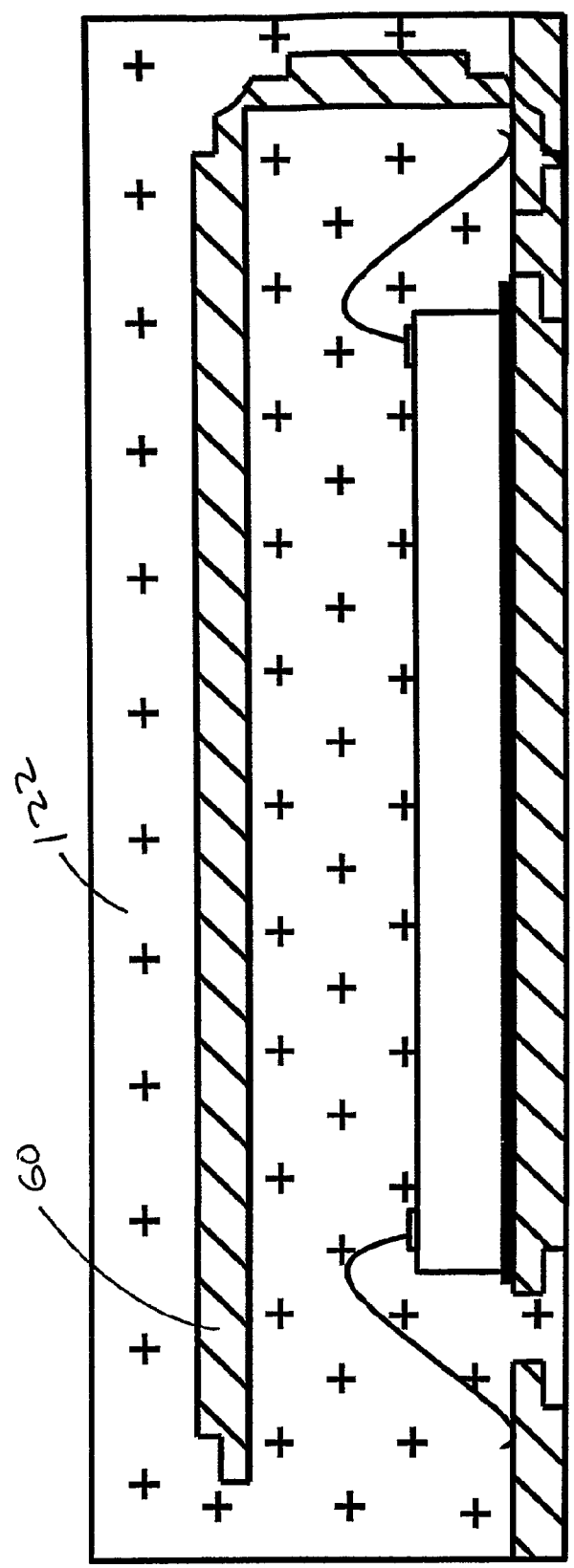
FIG. 37 shows a side elevation, cross-sectional view of an MLP-type package according to the invention with an entirely encapsulated, non-exposed cover pad.

For example, FIG. 37 shows the further embodiment where the package is equipped with an internal top metal pad 60 acting as an EMI shield. The top metal pad structure 60 is surrounded by the mould material 55 and no external exposure of the top pad is provided. The mould material defines the outer boundary of the top of the package.

Figure 38:
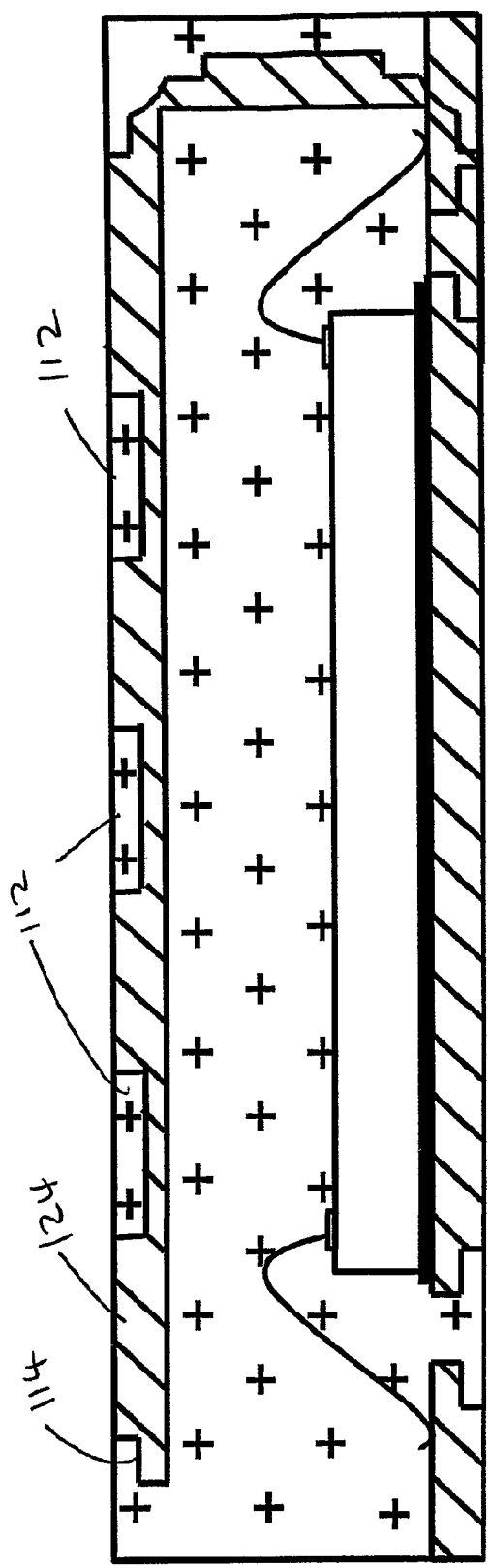
FIG. 38 shows a side elevation, cross-sectional view of an MLP-type package according to the invention with a partially exposed top metal pad.

FIG. 38 shows a side elevation, cross-sectional view of an MLP-type package with a partially exposed top metal pad EMI shield.

In this example the package is equipped with a partially exposed top metal pad 60. The top metal pad 60 provides a combined EMI shield and heat sink, shown here patterned with trenches 112 using the standard leadframe half-etch processes. The pattern formed by the trenches found in its outer surface 112 is designed to allow a controlled mould material ingress, improving manufacturability, and reliability by retaining the cover in place in the package. The patterned surface allows for improved interlocking of the pad 60 and mould material 55.

The highest points of the patterned top pad can be arranged to remain exposed after moulding. A partial external exposure of the top pad is therefore provided. The top pad pattern may be designed to still provide sufficient exposed metal for access to the top metal pad. The mould material partially defines the outer boundary of the top of the package. Package reliability is enhanced through the use of the extra anchor points provided at the patterned upper side of the top metal pad.

Figure 39:
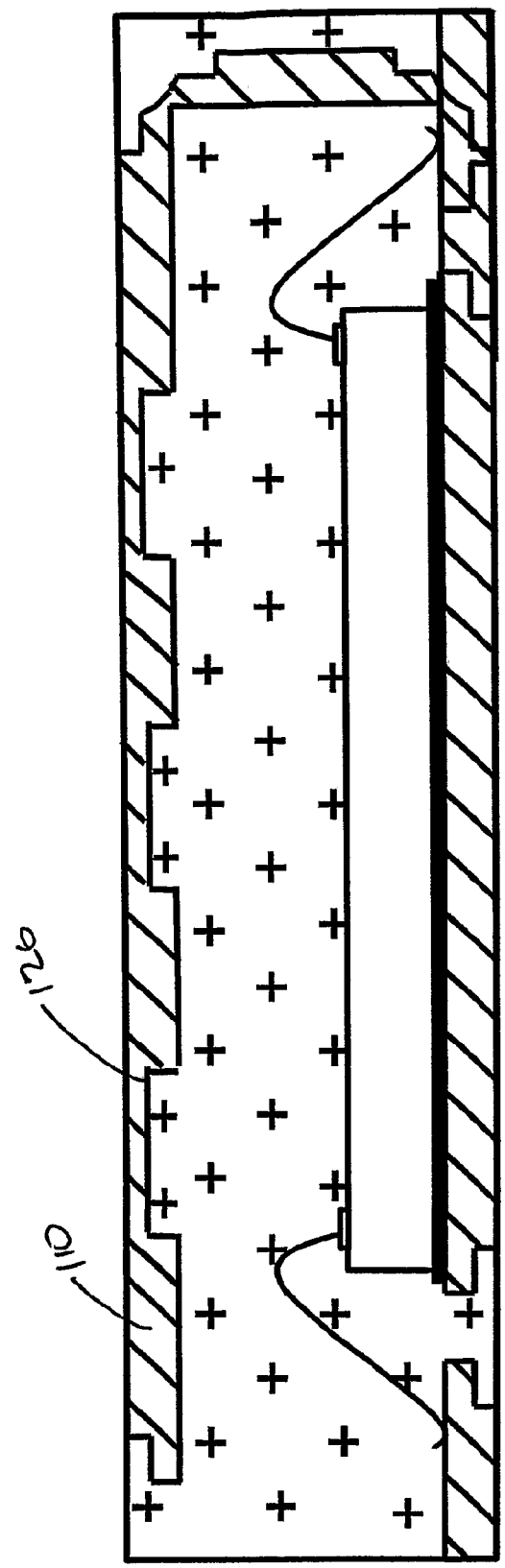
FIG. 39 shows a side elevation, cross-sectional view of an MLP-type package according to the invention with a patterned underside of the top metal pad.

FIG. 39 shows the cross-section of a package with the patterned trenches 126 underside of the top metal pad 60. Reliability of the package structure may be enhanced through the use of a patterned underside of the top metal pad, allowing improved integrity of the mould and frame structure. The pattern could be designed as a combined series of half-etch channels, fully etched holes or full thickness recesses. The design of the pattern can optimised for mould access and flow and to avoid air/gas bubbles.

Figure 40:
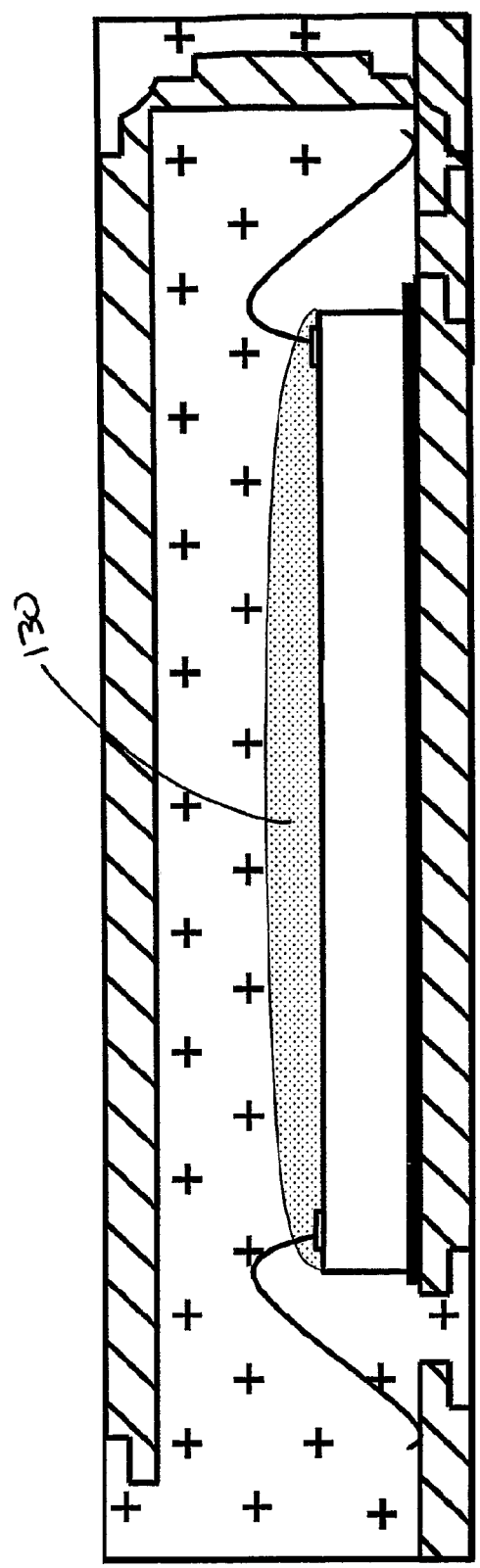
FIG. 40 shows a side elevation, cross-sectional view of an MLP-type package according to the invention showing a dielectric fill material dispensed over the die surface.

Other materials can also be combined in the MLP assembly. For example, FIG. 40 shows how a glob-top 130 or other suitable dielectric fill material may be dispensed over the active die surface and other subassembly structures (for example, wirebonds), prior to bending the top metal pad. This provides additional structural protection for the chips mounted in the package.

Figure 41:
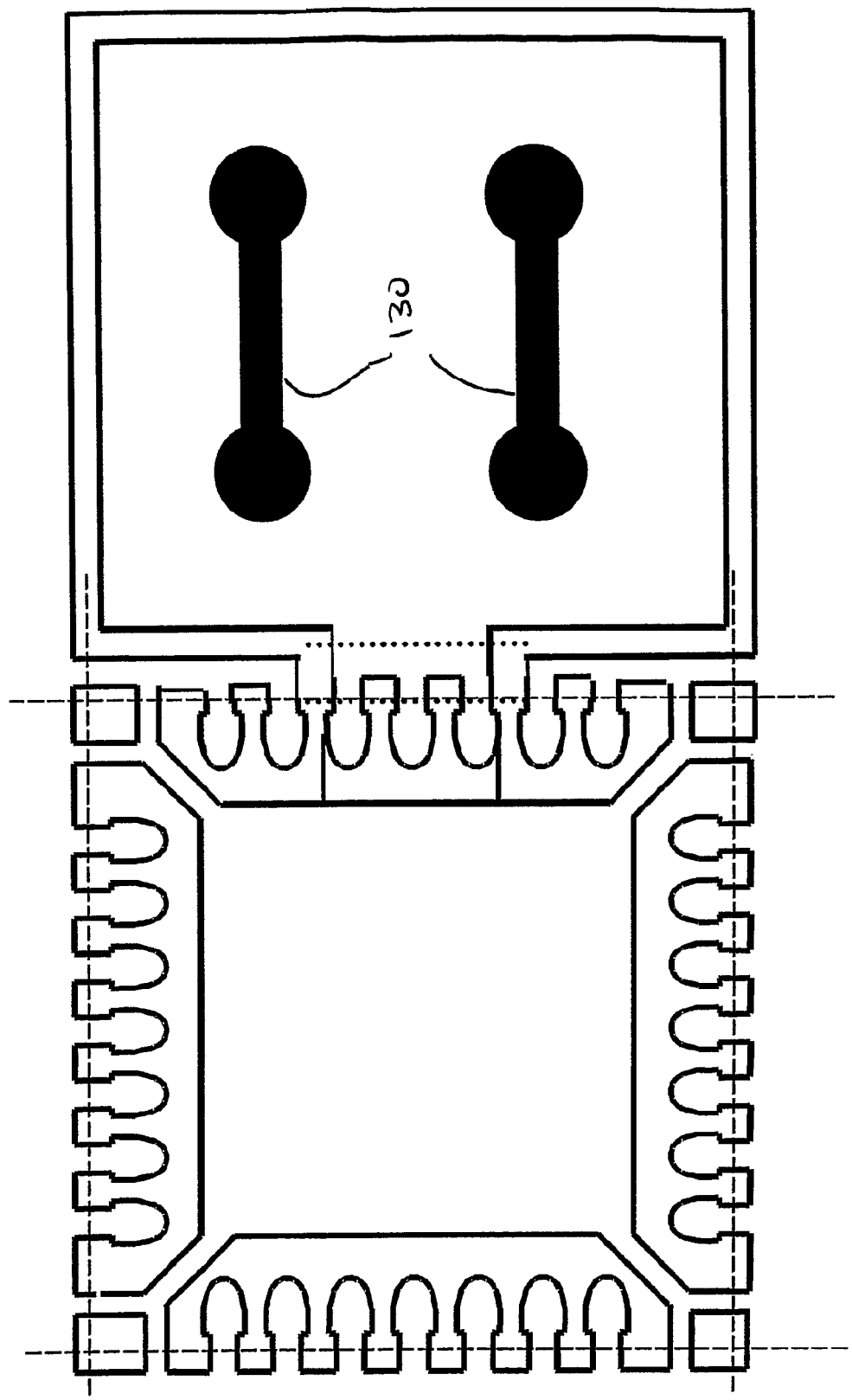
FIG. 41 shows a mounting for making an MLP-type package according to the invention with electromagnetic coupling apertures.

The electromagnetic coupling capabilities of the MLP package can also be further enhanced. For example, FIG. 41 shows how apertures or slots 130 are formed within the top metal pad to permit the electromagnetic coupling of waves of a certain frequency (wavelength) through the top metal pad. This structure may be of advantage for the mounting for a radio system's antenna or electromagnetic coupling to other popular microwave components such as filters and waveguides.

Figure 42:
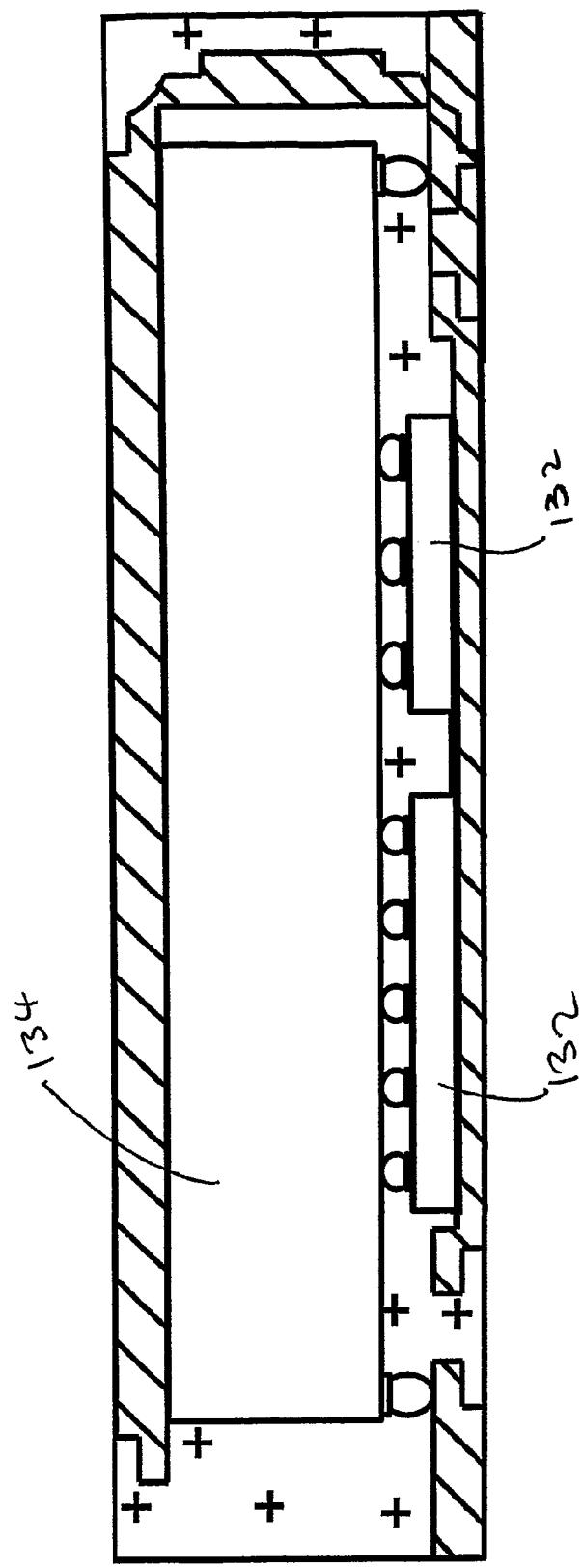
FIG. 42 shows a section through an MLP-type package according to the invention.
Figure 43:
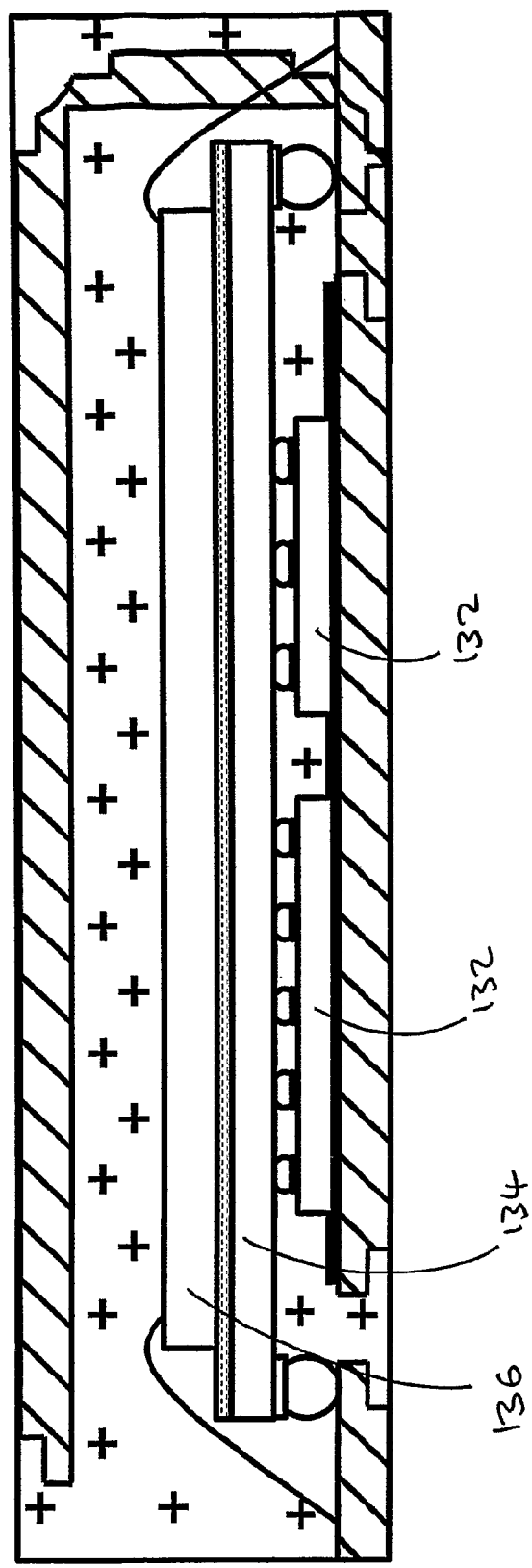
FIG. 43 shows a section through a further MLP-type package according to the invention.

FIGS. 42 and 43 show how further stack constructions can be used to optimise thermal, electrical and EMI shielding in a multiple die stack. Here two chips 132 are shown mounted conventionally and a third chip 134 is flip-chip mounted and connected to them. The basic design of having a top metal pad is unchanged.

In FIG. 42 the base die attach pad has been etched to a partial thickness using the techniques already discussed and FIG. 43 shows how solder spheres may be used to connect a mother die to the peripheral package pads.

The EMI shielding discussed above can be adapted to meet the appropriate government regulations and to further meet the operating requirements of the mounted semiconductor assembly, for example to provide immunity from other interfering RF signals or allow operation of RF circuitry within the package. The package and mounting can be adapted to meet appropriate regulations for various and known wireless standards. Furthermore, such RF SiP solutions as discussed above can provide for integrated antenna means in the cover 60.

The MLP packaging described above can be further adapted to include useful structures and functions.

Figure 44:
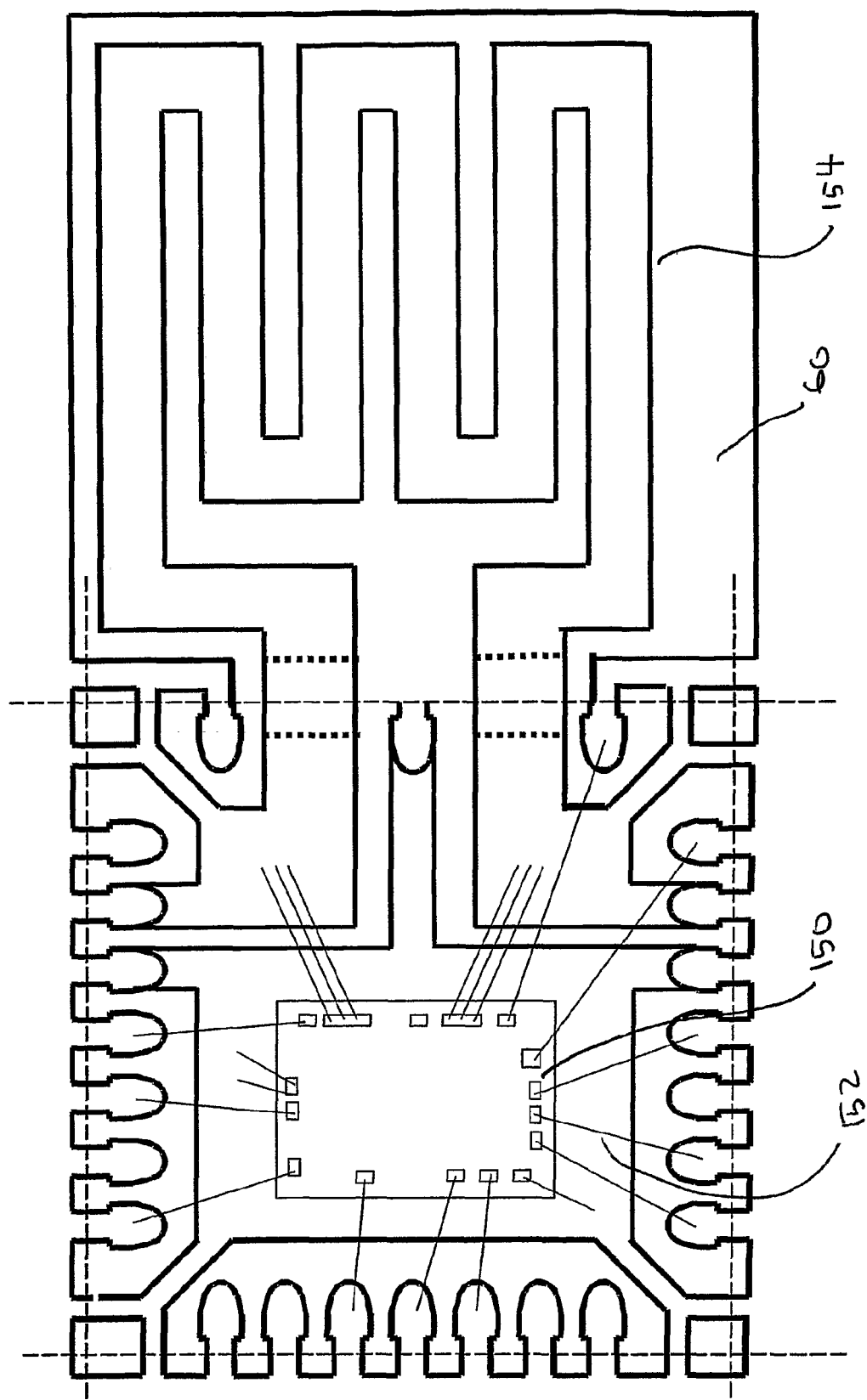
FIG. 44 shows a mounting for making an MLP package according to the invention with a cover pad including the definition of a serpentine inductor with a semiconductor chip shown mounted to the base with wirebonds connecting to the perimeter connectors and to the inductor.

For example, FIG. 44 shows how the top metal pad 60 can be defined with apertures to provide an inductive element 154. In this example, a semiconductor chip 150 is shown mounted with its wirebonds 152 connecting the chip to peripheral base pins. The top pad structure 60 is etched in a serpentine pattern 154 to form a serpentine inductor. The inductor is formed about the two connecting formations 59 equipped with defined bend points 70, (indicated by dotted lines) and thus sits above the mounted semiconductor once the package has been assembled as described above.

The example shown in FIG. 44 shows how the continuous serpentine path of the top metal pad 60 is designed to electrically and physically connect to peripheral or package base pins through two connecting formations 59 equipped with defined bend points. This connecting method provides a robust, reliable and low resistance connection to the inductive element 150 the two connecting formations may also be used to define the final package height.

Situating the inductive element in a parallel, upper plain above the semiconductor chip assembly and base/peripheral package pins further reduces the component package area.

The package design in the example shown in FIG. 44 also shows how wirebonds, or alternatively flip-chip connections, can be used to electrically connect the semiconductor chip to the peripheral package pins and base pads for connection to the inductive element.

When connected to a system neutral RF, for example, Ground or direct current Voltage Supply, the upper plain inductive element has the additional advantage of functioning as an integrated EMI shield and heatsink/heatspreader, as previously described above.

Figure 45:
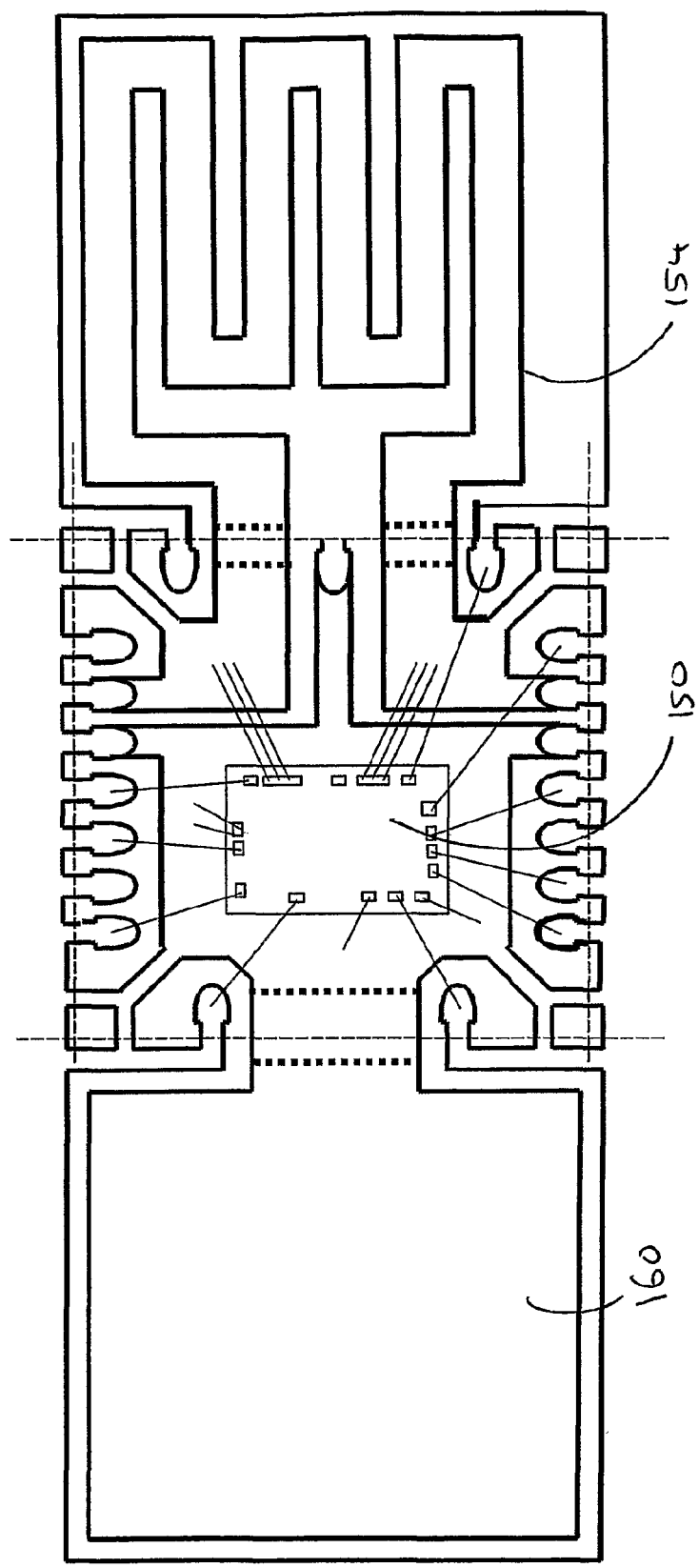
FIG. 45 shows a mounting for making a package according to the invention with a top cover pad in addition to a defined serpentine inductor.

It is further possible to combine the inductive element with a further metal pad, as shown in FIG. 45. In this example a second top metal pad 160 may be formed to fit over the semiconductor chip assembly and the inductive element. Electrical and physical isolation between the inductor and shield would be maintained. The separation between bend points in the single connecting formation connecting the top metal pad to the semiconductor ship die attach pad is greater than between those on the connecting formations for the inductor to provide sufficient final package height and to ensure that the cover is spaced from the inductor.

This approach to integrating inductive elements into the package can also be used for integrating other passive components such as capacitors, for example interdigitated capacitors. It would also be possible to extend the approach to help integrate other components such as microstrip couplers and filters.

FIG. 46 is a table of results of electromagnetic interference simulations for the package design shown in FIG. 2. A series of comparative simulations were conducted on a standard package with no top metal pad and the improved package with the top metal pad 60 acting as a shield. Using recognised methods of emission type EMI simulation, monitor points were distributed at representative positions surrounding the package.

The packages shown in the above examples can be demonstrated to provide a local EMI shield. The simulations show improvements in shield effectiveness of approximately 10 dB at application frequencies of up to 10 GHz for the E field, and of approximately 20 dB for the H field. Effective EMI shielding is important for meeting regulations on electromagnetic emissions, especially considering the higher frequencies at which modern electronics equipment operates. It will be appreciated that several design factors, such as the spacing between the cover or top pad and the semiconductor chip, and the overhang of the top pad, can be optimized to improve shielding effectiveness. Further simulated results for larger packages have shown improved results for shield effectiveness up to 40 dB at frequencies of up to 10 GHz.

Computer simulations of thermal dissipation in the package show improvements over conventional packages. The structure and immediate environment of the package was simulated using computational fluid dynamics software. The die sizes, materials and constant power dissipations assumed are given in the table of FIG. 47.

FIG. 48 is a table of results of thermal simulations for the multiple stacked die in a package as shown in FIG. 11. In this example two daughter die are flip-chip mounted onto a third mother die. In such a package the top metal pad would be attached to the rear top side of the daughter die using conductive epoxy and the mother die would be attached to the package using conductive epoxy.

As can be seen from the table, the heat dissipation simulations show improvements in heat dissipation of approximately 21 degrees C., an improvement of 22%, in the daughter chips 62,63 compared to standard packaging configurations. The thermal energy produced by the daughter die is dissipated through the packages internal structure to the printed circuit board.

By improving the thermal dissipation qualities of the packaging it is possible to mount more semiconductor chips that consume more power and therefore generate more heat. For example, it would be possible to drive semiconductor chips at higher speeds without failure due to overheating.

What is claimed is:

1. A mounted semiconductor assembly comprising:
    a semiconductor assembly consisting of a single semiconductor die;
    a first portion consisting of a base support with heat conducting surface for mounting the semiconductor assembly and peripheral electrical connectors;
    a second portion having a heat radiating surface; and
    a connecting portion joining the first and second portions and arranged to allow folding of the second portion over the first portion to form a cover, wherein the mounting comprises a sealing material completely encapsulating the connecting portion at least partially encapsulating the mounting and the semiconductor assembly such that at least part of a printed circuit board facing surface of the first portion base support and peripheral electrical connectors and the heat radiating surface of the second portion are left exposed and fixed in a position planar to the sealing material defined component outline and where the first and second portions have features for the provision of additional locking strength between the mounting and the sealing material.

2. A mounted semiconductor assembly according to claim 1 wherein the first portion of the mounting comprises a formation of a base support and electrical connectors each of which has a printed circuit board facing surface, which is not covered by said sealing material.

3. A mounted semiconductor assembly according to claim 2, wherein the formation of electrical connectors is in a spaced relationship with the first portion and are linked electrically with the semiconductor assembly.

4. A mounted semiconductor assembly according to claim 1, wherein the second portion is arranged to be in a spaced parallel relationship with the first portion.

5. A mounted semiconductor assembly according to claim 1, wherein the second portion further comprises at least one additional edge portion arranged to extend when the mounting is folded beyond at least one edge of the first portion of the mounting.

6. A mounted semiconductor assembly according to claim 5 wherein the mounting is in the form of an EMI enhanced package wherein the second portion is provided with four additional edge portions to define four walls to protect the semiconductor assembly.

7. A mounted semiconductor assembly according to claim 1, wherein the mounting is formed from a single sheet of electrically and thermally conducting material.

8. A mounted semiconductor assembly according to claim 7 wherein the single sheet of electrically and thermally conducting material is copper.

9. A mounted semiconductor assembly according to claim 1, wherein the connecting portion is provided with folding means to enable the folding of the second portion over the first portion.

10. A mounted semiconductor assembly according to claim 9 wherein the folding means is at least one weakened line in the mounting having a thickness that is less than that of the rest of the mounting.

11. A mounted semiconductor assembly according to claim 10 wherein the at least one weakened line is a scored line or an etched line in the mounting.

12. A mounted semiconductor assembly according to claim 9 wherein the folding means includes two weakened lines, one between the first portion and the connecting portion and one between the second portion and the connecting portion.

13. A mounted semiconductor assembly according to claim 1, wherein the mounting is provided with a third portion and second folding portion arranged to allow folding of the third portion over the second portion to form said cover, such that the third portion is in a spaced parallel relationship with the first portion and second portion.

14. A mounted semiconductor assembly according to claim 1, wherein the mounting further comprises a means for mounting surface mount technology (SMT) component which is a passive component.

15. A mounted semiconductor assembly according to claim 14 wherein the SMT mounting means comprises one or more recesses in the second portion.

16. A mounted semiconductor assembly according to claim 1, wherein the cover is patterned or formed to function as a passive component which is an antenna, an inductor, an interdigitated capacitor, a parallel plate capacitor, a microstrip coupler, a filter or combinations thereof.

17. A mounted semiconductor assembly according to claim 1, wherein the mounting further comprises means adapted for mounting a sensor semiconductor assembly, the sensor mounting means is adapted for mounting an image sensor semiconductor assembly, biometric sensor semiconductor assembly, pressure sensor semiconductor assembly or combinations thereof.

18. A mounted semiconductor assembly according to claim 1, wherein the cover is adapted to provide direct access to the semiconductor assembly, such direct access means comprises an aperture in the cover.

19. A mounted semiconductor assembly according to claim 18 wherein the mounted semiconductor assembly is further adapted to mount an optical component in relationship to an image sensor semiconductor chip.

20. A mounted semiconductor assembly according to claim 18 wherein the direct access means is further defined by having one or more recesses about its perimeter, which recesses face towards, or away from, a mounted semiconductor assembly.

21. A mounted semiconductor assembly according to claim 20, wherein the direct access means or the recesses can be used to locate a further component for use in the semiconductor assembly.

22. A mounted semiconductor assembly according to claim 1, wherein the mounting further comprises one or more recesses formed within the cover into which mould material can flow to secure the cover.

23. A mounted semiconductor assembly according to claim 1, which further comprises a means to permit coupling of selected frequencies of electromagnetic radiation through the mounting, the frequency coupling means comprises one or more apertures in the cover of appropriate dimension to permit coupling at a selected frequency.

24. A mounted semiconductor assembly according to claim 1, wherein the mounting further comprises a heat dissipation means to provide a low thermally resistive path between a mounted semiconductor assembly and the cover of the package.

25. A mounted semiconductor assembly according to claim 1, wherein the mounting is part of an array of a plurality of mountings.

26. A mounted semiconductor assembly according to claim 1 wherein the second portion is continuous.

27. A mounted semiconductor assembly according to claim 1 wherein the second portion functions as a heatsink.

28. A mounted semiconductor assembly according to claim 1 wherein the second portion functions as a low resistance and low inductive path to ground.

29. A mounted semiconductor assembly according to claim 1 wherein the second portion functions as a local electromagnetic shield.

\* \* \* \* \*